United States Patent [19]

Fukuda et al.

[11] Patent Number: 4,876,983

[45] Date of Patent: Oct. 31, 1989

[54] PLASMA OPERATION APPARATUS

[75] Inventors: Takuya Fukuda, Hitachi; Yasuhiro Mochizuki, Katsuta; Naohiro Momma, Hitachi; Shigeru Takahashi, Hitachiota; Noboru Suzuki, Hitachi; Tadasi Sonobe, Iwaki; Kiyosi Chiba; Kazuo Suzuki, both of Hitachi, all of Japan

[73] Assignees: Hitachi, Ltd.; Service Engineering Co. Ltd., both of Tokyo, Japan

[21] Appl. No.: 145,371

[22] Filed: Jan. 19, 1988

[30] Foreign Application Priority Data

Jan. 19, 1987 [JP] Japan .................................. 62-8062
Mar. 2, 1987 [JP] Japan .................................. 62-45259
Mar. 6, 1987 [JP] Japan .................................. 62-50090

[51] Int. Cl.$^4$ ..................... C23C 16/00; C23C 14/00
[52] U.S. Cl. ..................... 118/722; 118/500; 118/620; 204/157.43; 204/192.1; 427/38; 427/47
[58] Field of Search ..................... 118/722, 620, 500; 204/192.1, 157.43; 427/38, 47

[56] References Cited

FOREIGN PATENT DOCUMENTS 56-155535 12/1981 Japan .
57-79621 5/1982 Japan .
59-3018 1/1984 Japan .

OTHER PUBLICATIONS

Transactions of 31th Semiconductor Integrated Circuit Technology Symposium Held on Dec. 3 & 4, 1986, pp. 49-54, 61-66.

Primary Examiner—Bernard Pianalto
Attorney, Agent, or Firm—Kenyon & Kenyon

[57] ABSTRACT

A plasma operation apparatus utilizes plasma generated by a microwave cooperative with a magnetic field as to perform a surface operation on a specimen such as semiconductor substrates, such as, for example, thin film deposition, etching, sputtering and plasma oxidation. The apparatus particularly takes advantage of electron cyclotron resonance and is suitable for performing highly efficient and high-quality plasma operations.

18 Claims, 17 Drawing Sheets

DISTANCE IN THE DIRECTION OF
THE CENTRAL AXIS (mm)

F I G. 7
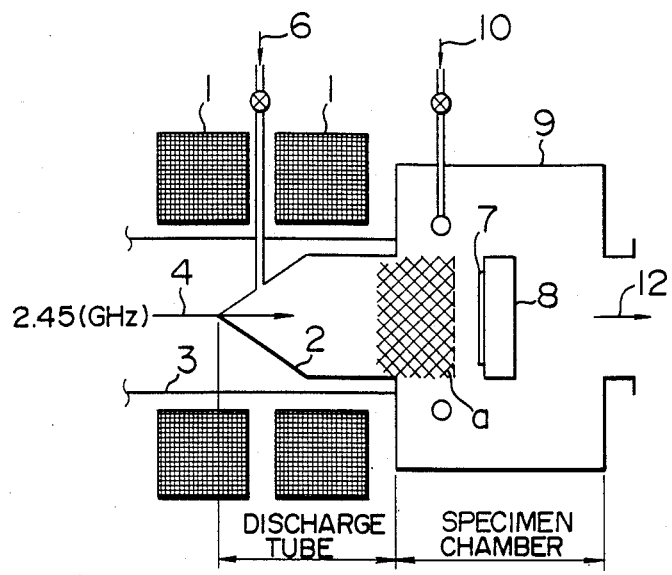
F I G. 8
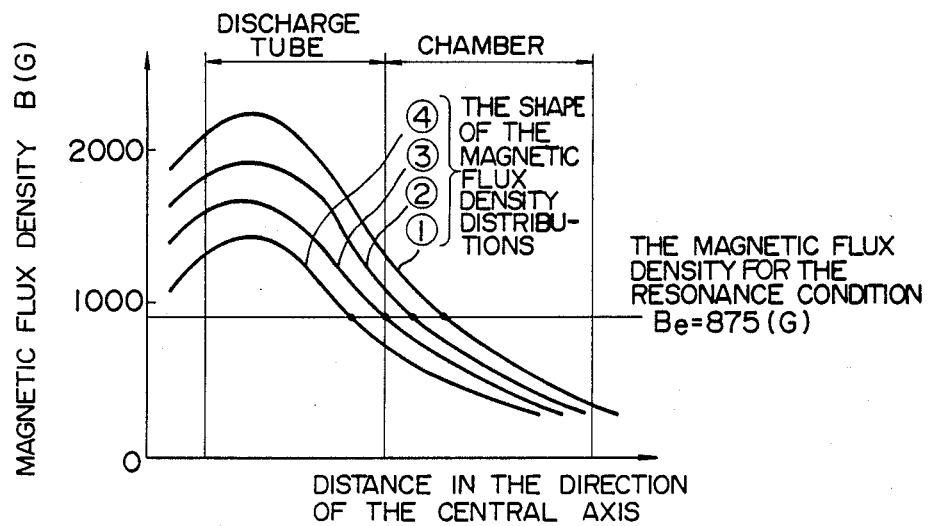

F I G. 13
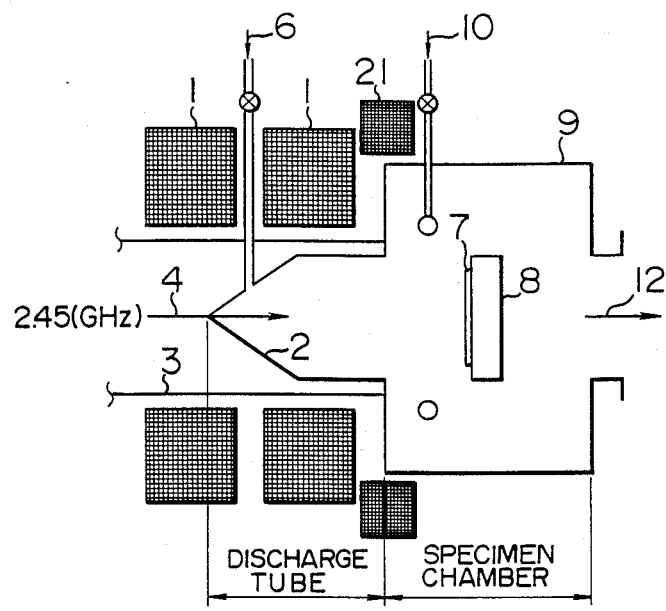
F I G. 14
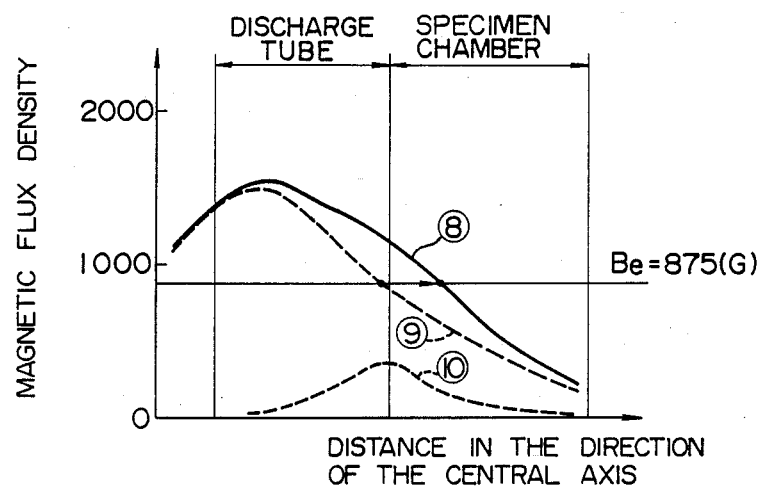

F I G. 17
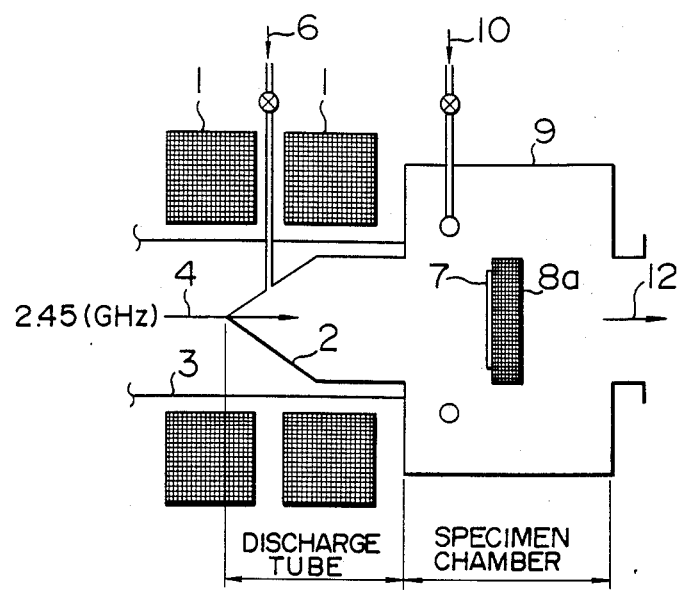
F I G. 18
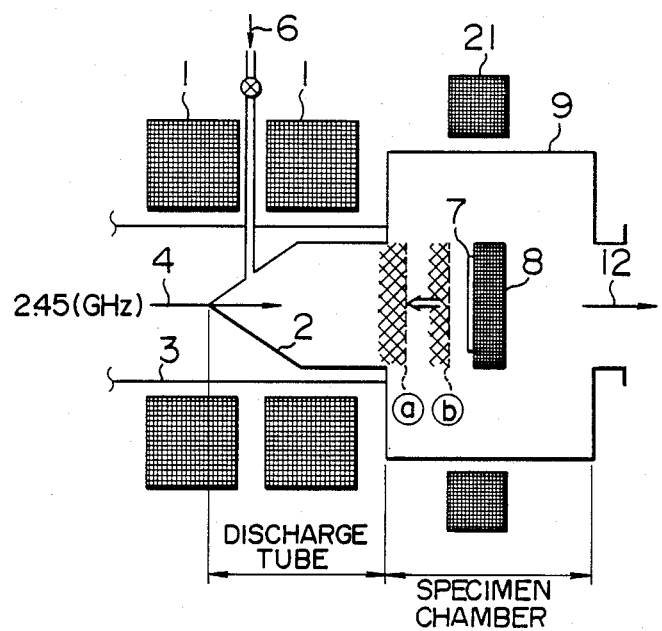

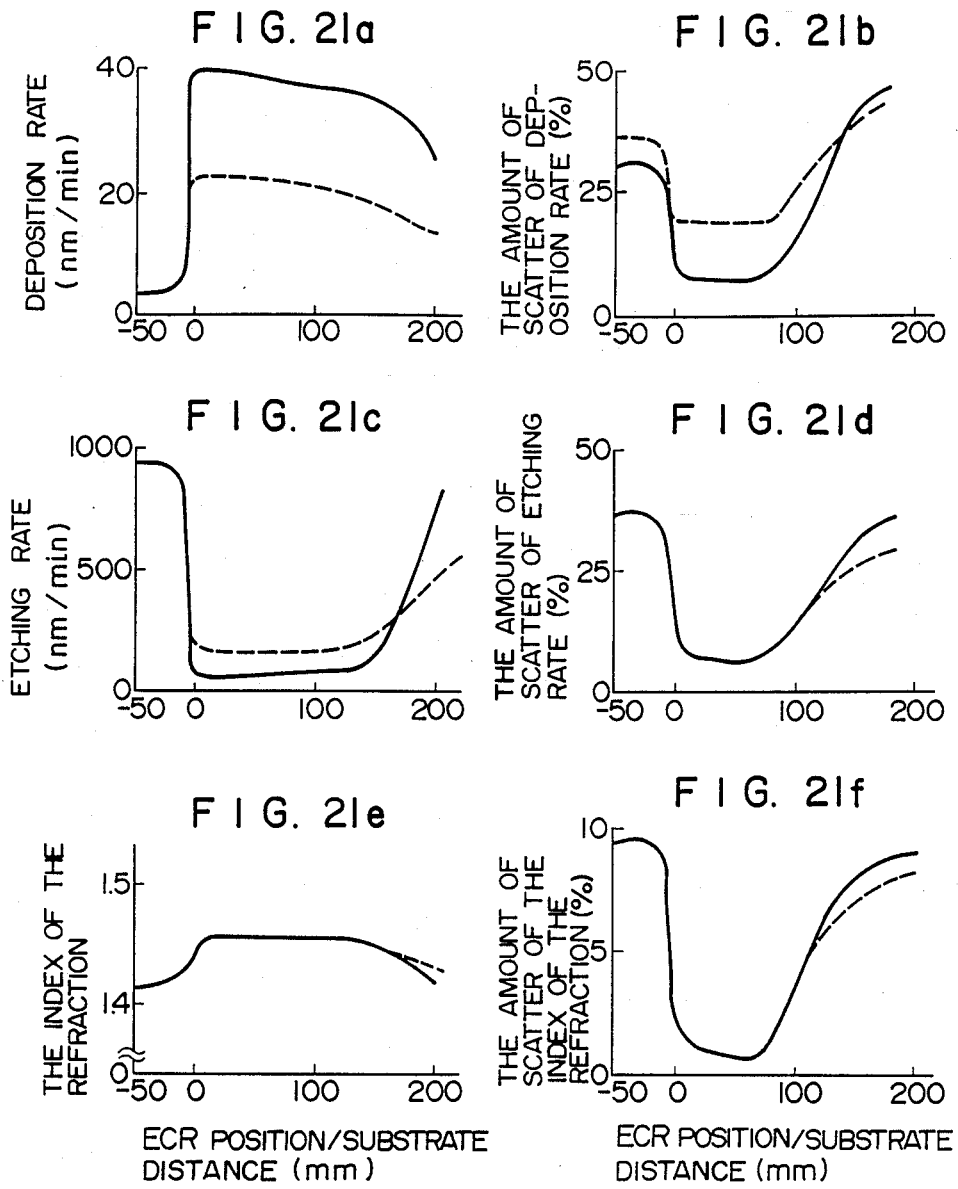

ECR POSITION/SUBSTRATE DISTANCE

ECR POSITION/SUBSTRATE DISTANCE

ECR POSITION/SUBSTRATE DISTANCE

ECR POSITION/SUBSTRATE DISTANCE

ECR POSITION/SUBSTRATE DISTANCE (mm)

ECR POSITION/SUBSTRATE DISTANCE (mm)

PLASMA OPERATION APPARATUS

BACKGROUND OF THE INVENTION

This invention relates to a plasma operation apparatus and more particularly to a plasma operation apparatus suitable for performing thin film deposition on a specimen (or substrate) surface or etching, sputtering or plasma oxidation for the specimen surface by utilizing plasma generated by microwave discharge.

The plasma operation apparatus utilizing plasma generated by microwave discharge prevailing in a magnetic field has, within a discharge tube (also called a plasma generation chamber) forming a part of discharge space, a position at which electron cyclotron resonance (ECR) is caused by the magnetic field and a microwave and has a magnetic flux density distribution which decreases from the ECR conditioning position toward a specimen stand disposed within a specimen chamber. Consequently, plasma generated near the resonance position is decreased in density by an order of one to two or more during its transport from the discharge tube to the specimen stand and the plasma operation can not be done with high efficiency.

FIG. 1 illustrates an apparatus disclosed in "CVD utilizing ECR plasma", Transactions of 31st Semiconductor Integrated Circuit Technology Symposium held on December 3 and 4, 1986, pp. 49–54 and referred to as prior art example A hereinafter.

In the prior art example A, when a microwave 4 is introduced, through a wave guide 3 and an incident window 5, into a discharge tube 2 surrounded by an external magnetic field coil 1 and the electron cyclotron motion in a magnetic field due to the magnetic coil 1 resonances with the microwave 4 at the resonance position, resonant electrons collide with and ionize a gas 6 for plasma, thus generating plasma. Under the influence of a magnetic field divergence, the generated plasma is then pushed out into a specimen chamber 9 coupled to the discharge tube 2 and housing a specimen stand 8 for carrying or holding a specimen 7. This plasma alone or along with atoms or molecules of a material gas 10 additionally introduced into the specimen chamber 9 and excited or ionized by that plasma is used for plasma operation of a surface of the specimen 7.

FIG. 2 shows a magnetic flux density distribution occurring between the microwave incident window 5 and the specimen stand 8, where a value along the axis ordinate represents the distance in the direction of the central axis measured from the origin located at the boundary between discharge tube 2 and specimen chamber 9 and abscissa axis represents the magnetic flux density. In the case of this prior art example A, the magnetic flux density Be effective to cause electron cyclotron resonance at a frequency of 2.45 GHz of the incident microwave 4 is 875 Gausses and FIG. 2 indicates that the resonance conditioning position is axially about 3 cm distant from the microwave incident window 5. Then, taking into account the characteristic of propagation of the microwave through the plasma and the resonance absorption condition for microwave energy, only a region inside the discharge tube 2 and which is within 3 cm distant from the microwave incident window 5 proves to be effective for plasma generation. Plasma generated in this region is transported over a distance of about 35 cm toward the specimen stand 8 under the influence of force due to the magnetic field divergence and of polarity diffusion. In this transport, the long transport distance and an abrupt decrease in the magnetic field (magnetic flux density) cause a loss and because of this loss, the density of plasma reaching the surface of the specimen 7 through transport tends to be smaller than that of plasma near the resonance position at which the electron cyclotron resonance occurs.

FIG. 3 illustrates another apparatus disclosed in "Films of a - Si:H prepared by ECR plasma enhanced CVD", Transactions of 31st Semiconductor Integrated Circuit Technology Symposium held on December 3 and 4, 1986, pp. 61–66 and referred to as prior art example B hereinafter, and FIG. 4 shows magnetic flux density distributions in the FIG. 3 apparatus. In FIG. 3, elements corresponding to those of FIG. 1 are designated by identical reference numerals. When compared to the magnetic flux density distribution of the prior art example A, the level of the magnetic flux density distributions shown in FIG. 4 is higher as a whole. It will also be seen from FIG. 4 that the position for 875-Gauss magnetic flux density corresponding to the ECR position still lies within the discharge tube 2 and magnetic flux density exceeding 875 Gausses also prevails within the discharge tube 2, indicating that a region effective for the resonance absorption of microwave measures about ⅔ of the discharge tube 2 at its maximum. In addition, the magnetic flux density is abruptly decreased toward the specimen stand 8. Consequently, as in the case of prior art example A, the density of plasma generated near the resonance position tends to suffer from a loss and decrease during diffusion of the plasma toward the surface of the specimen 7.

FIG. 5 illustrates still another apparatus disclosed in JP-A-59-3018 and referred to as a prior art example C hereinafter, and FIG. 6 shows a magnetic flux density distribution in the FIG. 5 apparatus. In FIG. 5, elements corresponding to those of FIG. 1 are designated by identical reference numerals. The prior art example C is directed to the configuration of a mirror magnetic field type frequently used in the plasma confinement method with the view of raising the plasma density and additionally has a complemental permanent magnet 13 for raising magnetic flux density near the surface of the specimen 7 housed in the specimen chamber 9. In this prior art example C, the incident microwave 4 propagates through a region designated at (I) in FIG. 6 in which the magnetic flux density is higher than that at the resonance position, and the microwave 4 then undergoes resonance absorption by the plasma near a first resonance position designated at s in FIG. 6. And, it is difficult for the microwave reaching the first resonance position to pass therethrough and propagate into a smaller magnetic flux density region designated at (II) in FIG. 6 because this tendency of the microwave is resisted by the plasma. If the propagation leaks for approaching a second resonance position designated at t in FIG. 6 which is near the specimen 7 on the specimen stand 8 and plasma is generated at the second resonance position, the plasma will be forced to direct toward the discharge tube owing to a magnetic field divergence appearing near the second resonance position, with the result that as in the case of prior art examples A and B, the density of plasma incident upon the specimen 7 tends to be smaller than that of the plasma near the first resonance position.

Disclosed in JP-A-56-155535 is still another apparatus wherein, as in the prior art example A, a plasma activated species is generated in a plasma generation chamber and a plasma flux stemming from the activated species under the application of a divergent magnetic field is bombarded for operation upon a substrate to be operated which is sufficiently distant from a region of the maximal production efficiency of activated species.

Further, a known plasma operation method as disclosed in JP-A-57-79621 intends to improve efficiency and employs a magnet disposed externally of a substrate operation chamber and which restricts the radius of plasma flux to raise plasma density.

All of the prior art described hereinbefore does not thoroughly consider the problem that the density of plasma generated by the microwave subject to the electron cyclotron resonance in the magnetic field suffers from a loss during transport of the plasma to the specimen surface, that is, the problem concerning life of the plasma activated species or deactivation thereof during transport of the plasma activated species to the substrate to be operated, and they can not always succeed in improving efficiency of the plasma operation. Also, in the prior art, excellent characteristics of the produced films e.g., densification, crystallinity and stoichiometry of the deposited films can not be obtained.

Another article relevant to the present invention is "Low Temperature Chemical Deposition Method Utilizing an Electron Cyclotron Resonance Plasma" by S. Matsuo and K. Kiuchi, Jpn. J. Appl. Phys. 22(4), L210, 1983.

SUMMARY OF THE INVENTION

A first object of this invention is to provide a plasma operation apparatus which can improve characteristics of films prepared by the operation and can increase operation speeds by improving utilization efficiency of the generated plasma.

A second object of this invention is to provide a plasma operation apparatus which can attain a highly efficient plasma operation by taking into account deactivation of a plasma activated species.

A third object of this invention is to attain a highly efficient plasma operation which can attain excellent characteristics of produced films such as represented by densification, crystallinity and stoichiometry of deposited films.

A first feature of this invention resides in that in a plasma operation apparatus, the magnetic flux density distribution starting from a plasma generation chamber (discharge tube) toward a specimen stand is so configured as to monotonously decrease, thereby providing a divergent magnetic field and that a position at which an ECR conditioning magnetic field is generated and at which the probability of generation of plasma is high is located at least partially within a specimen chamber to decrease the distance between the position at which high-density plasma is generated and a surface of a specimen.

A second feature of this invention resides in that in a plasma operation apparatus, the divergent magnetic field is provided and that a substrate to be operated on is displaced by 150 mm at the maximum or less, preferably less than 70 mm, from an ECR position at which the generation of a plasma activated species is maximized. The distance between the ECR position and the substrate to be operated can be adjusted by increasing magnetic flux density within the plasma generation chamber or controlling the magnetic flux density with high accuracy.

A third feature of this invention resides in that in a plasma operation apparatus, the divergent magnetic field is provided and that a range in which the magnitude of magnetic flux density is about 1.0 to 1.1 times that of magnetic flux density cooperating with the $TE_{01}$ mode (circular polarization) of a microwave to cause electron cyclotron resonance to extend continuously in the direction of plasma flux over a distance of degree of the mean free path of an activated species, i.e., at least 50 mm or more, or a distance range which requires the activated species to take a longer time than its mean life time to pass through the distance range. The range of the magnetic flux density having the above magnitude can be formed by disposing a plurality of divisional magnets aligned in the central axis direction of a vacuum system chamber or controlling the magnetic flux density with high accuracy.

According to the invention, high-density plasma can be transported to the surface of the specimen to be operated and a thin film of high quality can be formed on the specimen surface within a short period of time. Further, operation efficiency dependent on film deposition rate and the like can be improved to improve throughput of manufacture process. In addition, even on the substrate to be operated upon at low temperatures, films having characters such as crystallinity and densification which are comparable to those of films prepared through an operation utilizing chemical reactions at high temperatures can be formed.

Other objects and features of the present invention will become apparent from the following description.

BRIEF DESCRIPTION OF THE DRAWINGS

FIG. 7 is a schematic diagram illustrating a plasma operation system according to a first embodiment of the present invention.

FIG. 8 is a graph showing magnetic flux density distributions in the axis direction in the FIG. 7 apparatus.

FIG. 13 is a schematic diagram illustrating a plasma operation system according to a third embodiment of the present invention.

FIG. 14 is a graph showing a magnetic flux density distribution in the apparatus of FIG. 13.

FIG. 17 is a similar diagram of a sixth embodiment of the present invention.

FIG. 18 is a similar diagram of a seventh embodiment of the present invention.

FIGS. 21a to 21h are graphs showing various experimental data obtained with the FIG. 19 apparatus to prove characteristics thereof.

DESCRIPTION OF THE PREFERRED EMBODIMENTS

Figures 1, 2:
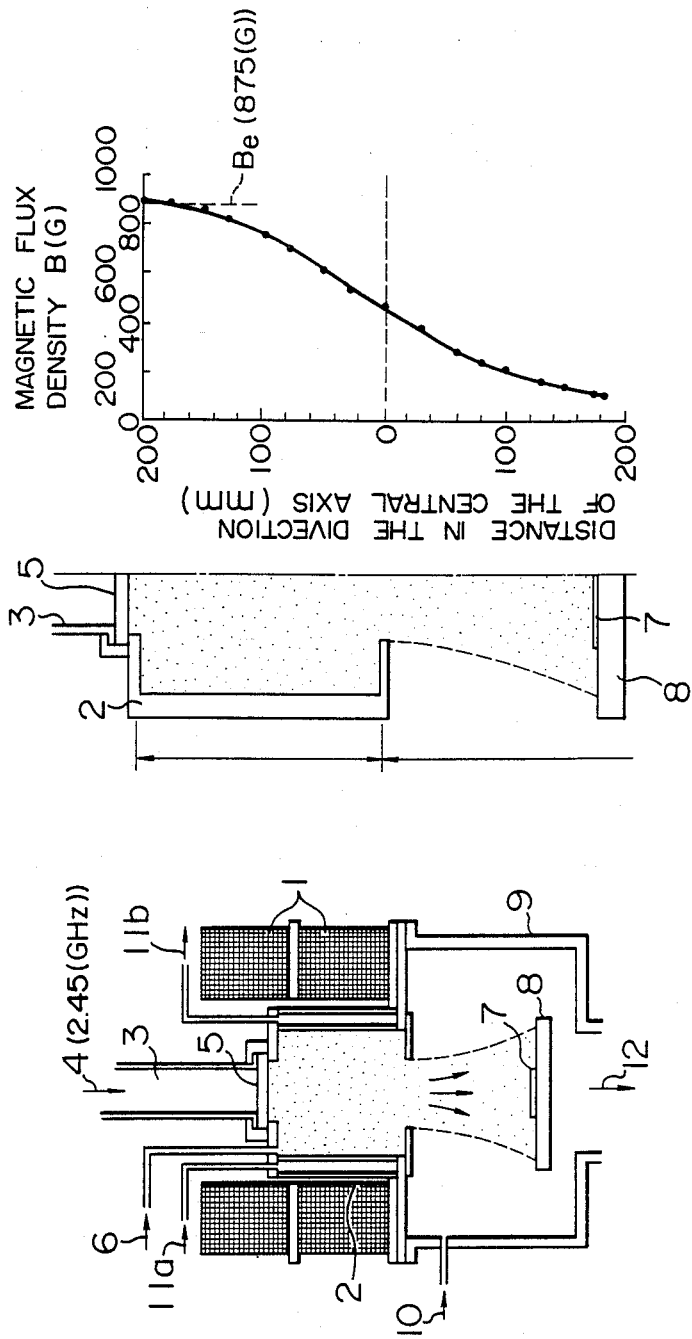
FIG. 1 is a fragmentary sectional view illustrating a plasma operation apparatus according to a first prior art example.
FIG. 2 is a diagram showing a magnetic flux density distribution in the central axis direction in the apparatus of FIG. 1.
Figure 3:
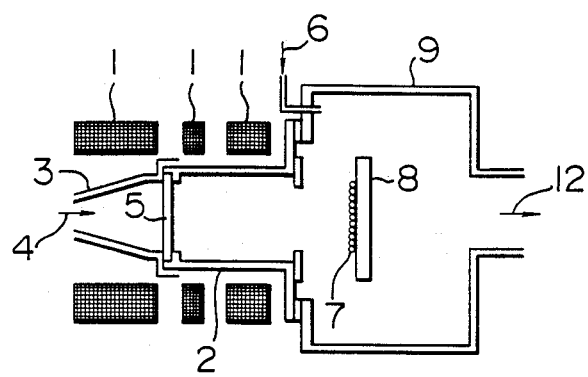
FIG. 3 is a fragmentary sectional view illustrating a plasma operation apparatus according to a second prior art example.
Figure 4:
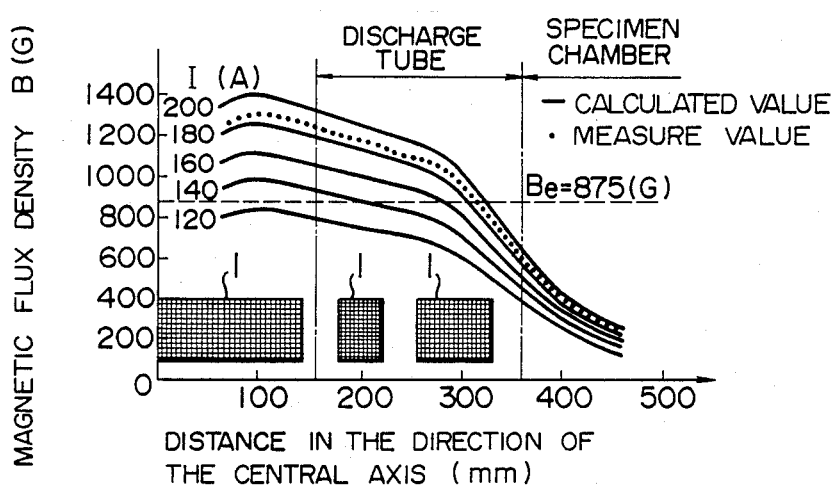
FIG. 4 is a graphic representation showing magnetic flux density distributions in the central axis direction in the FIG. 3 apparatus.
Figure 5:
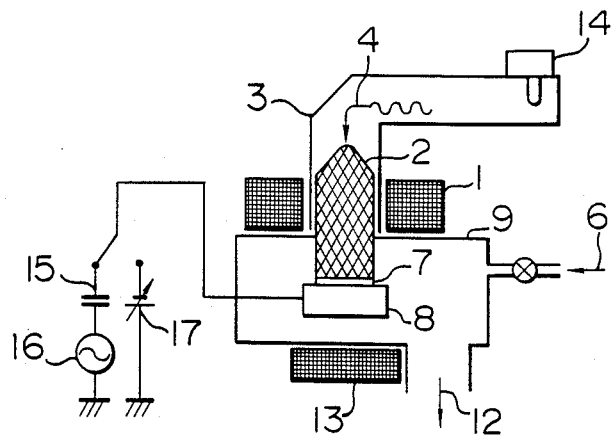
FIG. 5 is a schematic diagram illustrating a plasma operation apparatus according to the third prior art example.
Figure 6:
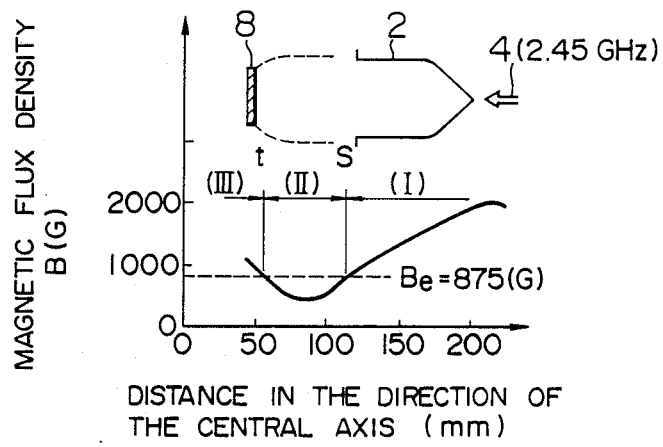
FIG. 6 is a graphic representation showing a magnetic flux density distribution in the central axis direction in the FIG. 5 apparatus.

Generally, a microwave propagating through a magnetic field to cause electron cyclotron resonance is of clockwise circular polarization and this microwave is cut off by a magnetic field having the magnitude of magnetic flux density smaller than that of magnetic flux density necessary for causing the electron cyclotron resonance and consequently can not propagate through the magnetic field. The present invention takes advantage of this phenomenon and is constructed such that the magnitude of magnetic flux density at the incident edge of a discharge tube is made larger than that of magnetic flux density at the ECR position and the former magnetic flux density has a distribution which gradually decreases, starting from the discharge tube, toward a specimen stand, that a position at which the magnetic field and microwave cooperate together to cause the electron cyclotron resonance is located within a specimen chamber to provide a range which extends into the specimen chamber and in which the magnitude of magnetic flux density is larger than that of the resonance conditioning magnetic flux density to thereby generate high-density plasma, and that the distance over which plasma, pushed out under the influence of a magnetic field divergence is transported to the specimen stand is minimized or zeroed in an extremity. With the above construction, in order to avoid the disadvantage of the plasma density abruptly decreasing within a region in which the magnitude of magnetic flux density is smaller than that of the resonance conditioning magnetic flux density, the distance between resonance position and specimen stand can be minimized sufficiently, making it possible to transport high-density plasma to a surface of a specimen.

FIRST EMBODIMENT

A plasma operation apparatus according to a first embodiment of the invention which is relevant to the aforementioned first feature will be described with reference to FIGS. 7, 8, 9 and 10.

This embodiment of plasma operation apparatus is constructed as shown in FIG. 7 to perform a specimen surface operation (deposition) based on magnetic field/microwave discharge. In operation, a microwave 4 is introduced through a wave guide 3 into a discharge tube 2 surrounded by an external magnetic field coil 1 and a gas 6 for plasma is excited or ionized under the influence of electron cyclotron resonance caused by the electron cyclotron motion in a magnetic field due to the magnetic field coil 1 and the microwave 4, thereby generating plasma. Under the influence of a divergence of the magnetic field generated by the magnetic field coil 1, the generated plasma is then pushed out into a specimen chamber 9 coupled to the discharge tube 2 and housing a specimen stand 8 for carrying or holding a specimen 7 to be operated upon. This plasma, along with a material gas 10 additionally admitted toward the front of the specimen 7 inside the specimen chamber 9 and excited or ionized by the plasma flux, is transported to the surface of the specimen 7 so as to deposit a thin film having constituents of the plasma gas 6 and material gas 10 on the surface of the specimen 7.

FIG. 8 shows magnetic flux density distributions in the axis direction of the FIG. 7 apparatus between the discharge tube 2 and the specimen stand 8, where ordinate represents the distance in the axis direction and abscissa represents the magnetic flux density. In FIG. 8, the shape of distributions indicated by curves ① and ② is characteristic of this invention, the shape of magnetic flux density distribution indicated by curve ③ is obtained with an instance where the position of the ECR conditioning magnetic field is located at the boundary between discharge tube 2 and specimen chamber 9, and an example of magnetic flux density distribution indicated by curve ④ is for the aforementioned literature by S. Matsuo and K. Kiuchi.

Returning to FIG. 7, the position (position a in FIG. 7) corresponding to the resonance conditioning magnetic flux density ($Be = 875$ Gausses) pursuant to the curve ① is located within the specimen chamber 9 and therefore, the microwave 4 (2.45 GHZ) introduced into the discharge tube 2 through the wave guide 3 propagates through a region inside the discharge tube 2 in which the magnetic flux density exceeds the resonance conditioning magnetic flux density. As the microwave enters the specimen chamber 9 and approaches the resonance conditioning position, ionization and excitation become active under the influence of electron cyclotron resonance and in proportion thereto, the plasma density at the specimen position is increased, providing the plasma generation probability which is maximized at the resonance position. And, because of the nature of clockwise circular polarization effective for causing electron cyclotron resonance, the microwave tending to pass through the high magnetic flux density region and propagate into a magnetic field having the magnetic flux density smaller than the resonance conditioning magnetic flux density (in this embodiment, 875 Gausses) is cut off and prevented from propagating, with the result that part of the microwave which has not been absorbed by resonance into the plasma is reflected at the resonance condition position. It therefore follows that almost no plasma generation takes place in the low magnetic flux density region which is offset from the resonance position toward the specimen stand 8. The plasma reaching the surface of the specimen 7 contains plasma transported by polarity diffusion attendant on the magnetic field gradually decreasing, starting from the resonance position, toward the specimen stand 8 as well as atoms and molecules of the material gas 10 admitted near the resonance position and ionized and excited by the plasma flux. Accordingly, the plasma density distribution starting from the resonance position toward the specimen stand 8 exhibits an abrupt decrease. However, according to the present embodiment, the distance between the resonance position and the specimen surface can be adjusted so as to be minimized or zeroed in an extremity, so that the specimen surface may be located to precede a position at which the plasma density begins to decrease abruptly. As a result, the operation rate, substantially proportional to the electron density near the surface of the specimen 7, will not be decreased and besides the ion density contributing to ion bombardment affecting the densification of deposited films can be selected properly, thus ensuring that a thin film of high quality can be deposited within a short period of time. Obviously, the magnitude of magnetic flux due to the magnetic field coil 1 of the present embodiment is so selected as to provide the resonance condition position which lies within the specimen chamber 9.

Figure 9:
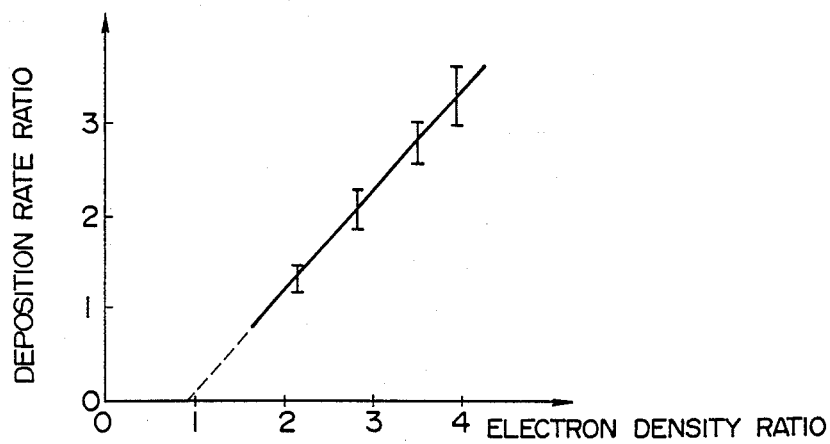
FIG. 9 is a graph showing the relation of deposition rate ratio obtained during deposition with the FIG. 7 apparatus with respect to the shape of the magnetic flux distributions and the electron density ratio related thereto.

FIG. 9 shows deposition rate for depositing thin films on the specimen surface with the apparatus of the present embodiment. Values are measured under the condition that film composition is constant. In FIG. 9, the lower abscissa represents the shape of the magnetic flux density distribution in terms of curves ① to ④ shown in FIG. 8, the upper abscissa represents, in arbitrary scale, electron density ratio on the specimen surface corresponding to the respective points ① to ④, and ordinate represents deposition rate ratio in arbitrary scale. FIG. 9 clearly demonstrates that when the resonance position is located within the specimen chamber as indicated by points ① and ② in FIG. 9, the electron density is increased to increase the deposition rate ratio, especially, in proportion to the degree to which the resonance position to the surface of the specimen 7.

Figure 10:
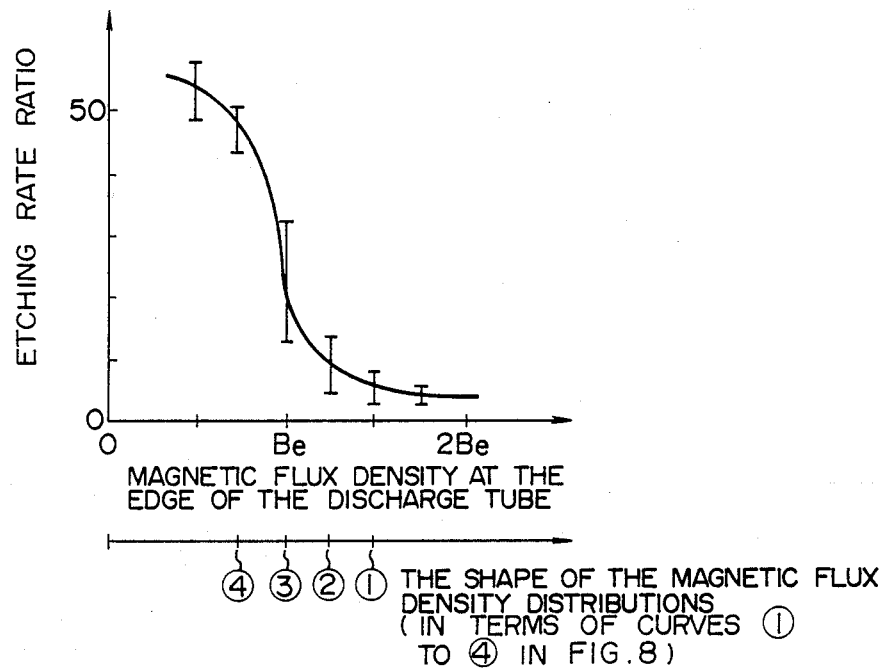
FIG. 10 is a graph showing the relation between etching rate ratio for deposited thin films obtained with the FIG. 7 apparatus and magnetic flux density.

FIG. 10 shows etching rate ratio representative of densification of thin films deposited on the specimen surface with the apparatus of this first embodiment, where the lower abscissa represents the shape of the magnetic flux density distribution in terms of curves ① to ④ shown in FIG. 8, the upper abscissa represents the magnetic flux density at the edge of discharge tube 2 which lies at the boundary between discharge tube 2 and specimen chamber 9, in terms of the magnitude of the magnetic flux density at the resonance condition position being Be, and the ordinate represents etching rate ratio in arbitrary scale. FIG. 10 clearly demonstrates that when the resonance position is drawn into the specimen chamber 9 as indicated by points ① and ② in FIG. 10, the etching rate ratio is small proving that highly dense films are prepared and the plasma density near the specimen surface is high bringing about sufficient ion bombardment effect during film deposition.

As described above, according to the present embodiment, by providing the monotonously decreasing shape for a magnetic flux density distribution starting from the discharge tube toward the specimen stand and by locating the position at which the ECR conditioning magnetic field is generated at least partially within the specimen chamber, the high-density plasma can be generated near the specimen surface and highly dense thin films can be prepared at high deposition rates.

SECOND EMBODIMENT

Figure 11:
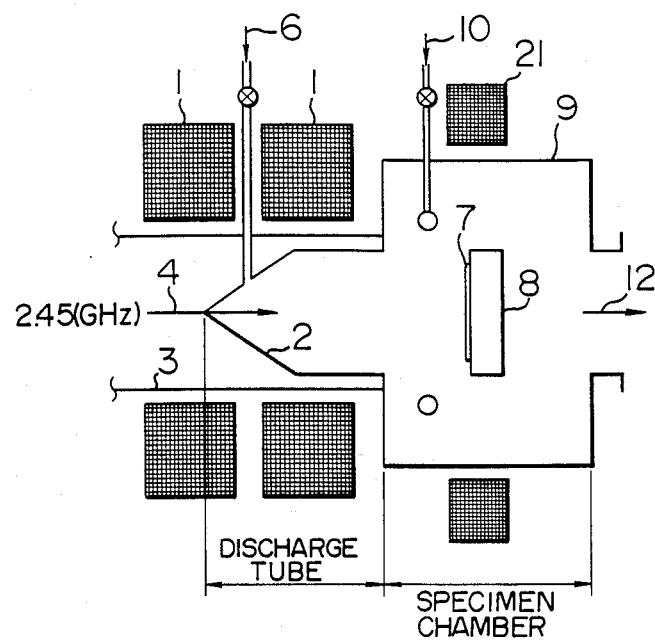
FIG. 11 is a shematic diagram illustrating a plasma operation system according to a second embodiment of the present invention.
Figure 12:
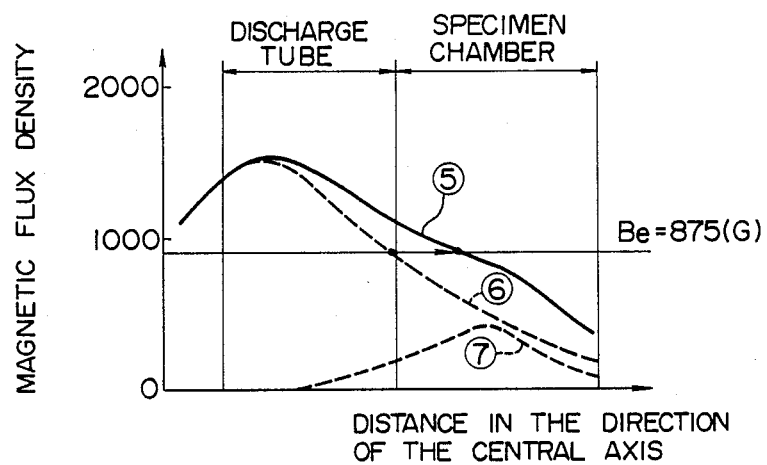
FIG. 12 is a graph showing a magnetic flux density distribution in the FIG. 11 apparatus.

Referring to FIG. 11, there is illustrated a plasma operation apparatus according to a second embodiment of the invention. In comparison with the FIG. 7 embodiment, this second embodiment of FIG. 11 additionally comprises a complemental magnetic field generation means 21, disposed externally of the specimen chamber 9, for generating within the specimen chamber 9 a magnetic field which aids in locating the position at which the ECR conditioning magnetic field is generated within the specimen chamber 9. FIG. 12 shows a magnetic flux density distribution in the axis direction of the FIG. 11 apparatus. In FIG. 12, broken-line curve ⑥ indicates a magnetic flux density distribution obtained with only the magnetic field coil 1 shown in FIG. 11 and broken-line curve ⑦ indicates a magnetic flux density distribution obtained with only the complemental magnetic field generation means 21. Accordingly, in the apparatus of FIG. 11, the curves ⑥ and ⑦ are superimposed together to provide a magnetic flux density distribution indicated by solid-line curve ⑤ in FIG. 12 by which the position of the ECR conditioning magnetic field is drawn in an arrow direction in FIG. 12 so as to be located within the specimen chamber 9. The complemental magnetic field generation means 21 is required to supply magnetic flux density of a magnitude of about 50 Gausses or more which is effective to locate the resonance condition position within the specimen chamber 9. Advantageously, in this embodiment, the magnetic field coil 1 can be reduced in size to attain the same effect as that attained with the FIG. 7 embodiment and in addition, by adjusting the complemental magnetic field generation means 21, the position of the resonance conditioning magnetic field can be adjustably moved without greatly affecting the magnetic field distribution inside discharge tube 2 established by the magnetic field coil 1 and the radius and density of the plasma drawn by the complemental magnetic field generation means 21 can be controlled.

THIRD EMBODIMENT

FIG. 13 illustrates a plasma operation apparatus according to a third embodiment of the invention wherein the same complemental magnetic field generation means 21 as that used in the FIG. 11 embodiment is disposed externally of the specimen chamber 9 at a substantially intermediate position between discharge tube 2 and specimen chamber 9. FIG. 14 shows a magnetic flux density distribution in the axis direction of the FIG. 13 apparatus. In this embodiment, a magnetic field due to the magnetic field coil 1 only as indicated by broken-line curve ⑨ in FIG. 14 and a magnetic field due to the complemental magnetic field means 21 only as indicated by broken-line curve (10) in FIG. 14 are superimposed together to provide a magnetic flux density distribution as indicated by solid-line curve (8) in FIG. 14. Thus, the third embodiment attains the same effect as that attained by the second embodiment illustrated in FIG. 11.

FOURTH EMBODIMENT

Figure 15:
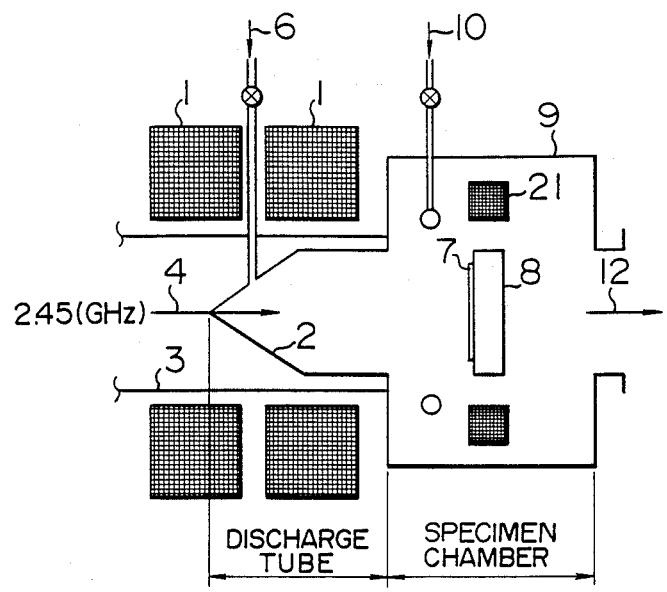
FIG. 15 is a schematic diagram illustrating a plasma operation system according to a fourth embodiment of the present invention.

As shown in FIG. 15, a fourth embodiment of the invention comprises a complemental magnetic field generation means 21 disposed inside the specimen chamber 9 to attain the same effect as that by the foregoing embodiments.

FIFTH EMBODIMENT

Figure 16:
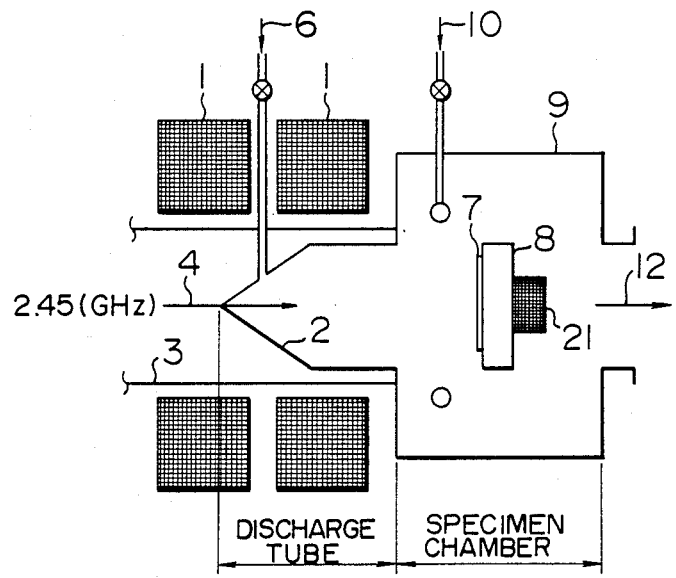
FIG. 16 is a similar diagram of a fifth embodiment of the invention.

As shown in FIG. 16, a fifth embodiment of the invention comprises a complemental magnetic field generation means 21 disposed at the back of the specimen stand 8 within the specimen chamber 9, attaining the same effect as that by the foregoing embodiments.

SIXTH EMBODIMENT

As shown in FIG. 17, a sixth embodiment of the invention comprises a complemental magnetic field generation means 21 playing the part of the specimen stand 8 within the specimen chamber 9 and serving as a specimen stand 8a with complemental magnetic field generation means. The sixth embodiment constructed as above can also attain the same effect as that by the foregoing embodiments.

SEVENTH EMBODIMENT

A seventh embodiment of the invention as illustrated in FIG. 18 acts as an etching apparatus. The gas 6 for plasma also serves as an etching gas. Since the position of the resonance conditioning magnetic field at which the probability of plasma generation is high can be controlled by means of the complemental magnetic field generation means 21 so as to be located within the specimen chamber 9, especially, between positions (a) and (b) shown in FIG. 18, the proper etching condition can advantageously be set for the specimen 7 to be operated upon.

In the foregoing embodiments, the magnetic field has been described as having the shape of magnetic flux density distribution which substantially monotonously decreases starting from the discharge space into which the microwave is introduced toward the specimen stand but more briefly, the distribution may be so configured as to permit the resonance condition position to lie on a curved surface within the specimen chamber. In an alternative, the distance between the specimen and the resonance condition position may be lessened by moving the specimen stand. In the apparatus of the foregoing embodiments, the pressure within the plasma generation chamber is not limited to $1 \times 10^{-2}$ Torr or less in contrast to the prior art apparatus described in connection with FIGS. 1 to 6.

Since in the plasma operation apparatus according to the previous embodiments the magnetic flux density distribution is so configured as to monotonously decrease and the position of the ECR conditioning magnetic field at which the probability of plasma generation is high is located within the specimen chamber and besides the distance between the position for high-density plasma generation and the specimen surface is lessened, a very efficient plasma operation can be achieved wherein the high-density plasma can be transported to the specimen surface to prepare thin films of high quality at high operation speeds.

An embodiment of the invention which is relevant to the aforementioned second feature will now be described.

The reaction gas is activated by microwave plasma discharge, especially, most efficiently activated near the ECR position. An activated species thus created then loses its activity on account of energy dispersion or sometimes it is deactivated on account of interparticle interaction due to its collision with other particles. Accordingly, a decreased distance between the substrate or specimen surface to be operated on and the ECR position can permit the plasma activated species to reach the substrate while keeping activity of the plasma activated species high. This leads to a highly efficient plasma operation and inproved plasma operation characteristics. When taking deposition of a film on the substrate, for instance, the higher the vibrational force between electron energy bonded atoms and rotation and translation energy of molecules or atoms to be deposited, the higher is the probability that in the plasma the molecules or atoms are not ganged or that individual molecules or atoms remain as single particle. Under this condition, a deposited film advantageously approaches a film prepared by thermal chemical reaction. Further, because of the high kinetic energy, the activated species deposited on the substrate has a high probability of its reconfigurational and reorientational motion toward a molecular layer preexistent on the substrate until the energy of the activated species is minimized at a destination of the reconfigurational and reorientational motion. Therefore, the deposited film can be increased in densification and crystallinity. In addition, stoichiometric ratio of the deposited film approaches that of a film prepared by thermal chemical reaction.

If, otherwise, the magnetic field distribution B(Z), where Z is a coordinate position on a vacuum-chamber-center-axis coordinate system which is positive in the direction of plasma flux, is not monotonously decreasing, there exists a position satisfying $dB/dZ > 0$ and at which the microwave is prevented from propagating and the generation or production efficiency of the plasma activated species is disadvantageously degraded.

EIGHTH EMBODIMENT

Figure 19:
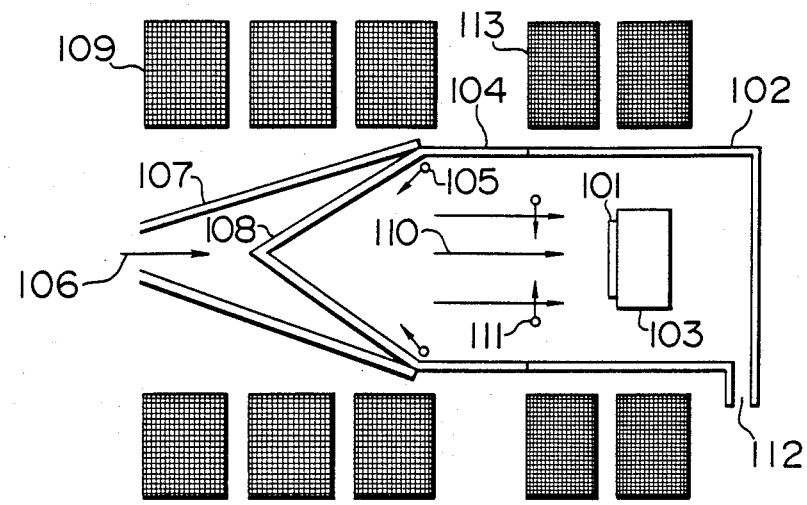
FIG. 19 is a similar diagram of an eighth embodiment of the present invention.
Figure 20:
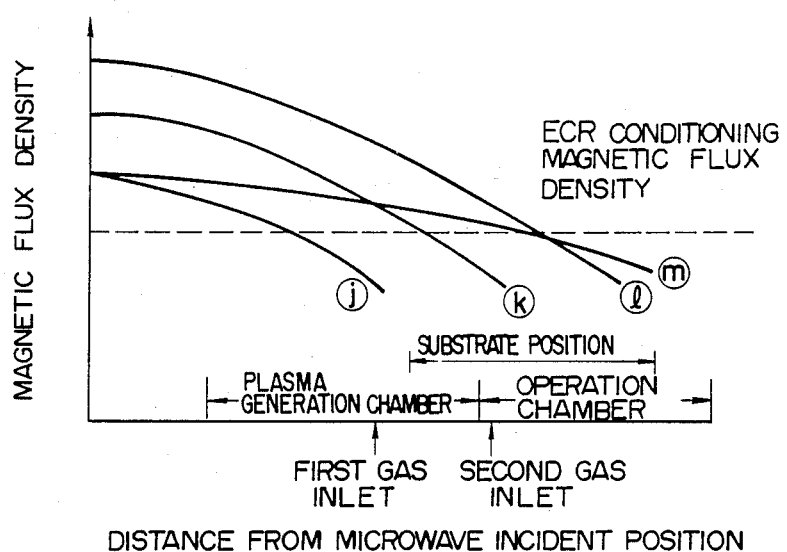
FIG. 20 is a graph showing magnetic flux density distributions in the axis direction in the FIG. 19 apparatus.

A plasma operation apparatus according to an eighth embodiment of the invention is schematically illustrated in FIG. 19. The apparatus comprises a plasma generation chamber 104, a microwave guide 107 (an oscillator for a microwave is not illustrated), ECR magnetic field coils 109 and 113, an operation (specimen) chamber 102, an evacuation conduit 112 (an evacuation system is not illustrated), reaction gas supply nozzles 105 and 111 (a reaction gas supply system is not illustrated) and a substrate holder (specimen stand) 103. The plasma generation chamber 104 is made of colorless quartz and has a diameter of 240 mm and a length of 250 mm with its top cone serving as a microwave incident window 108. The ECR magnetic field coils 109 and 113 respectively surround the plasma generation chamber and the operation chamber and are operable to provide a maximum of magnetic flux density of 2.6 K Gausses within the plasma generation chamber. The coils 109 and 113 are respectively divided into three and two sub-coils which can be adjusted separately to control the magnetic flux density. The operation chamber 102 is made of stainless and has a diameter of 240 mm. The substrate holder 103 having a diameter of 120 mm and placed in the operation chamber is made of alumina and its position is variable along the direction of plasma flux (in the right and left directions in the drawing). FIG. 20 graphically exemplifies magnetic flux density distributions in the direction of microwave propagation. Various distributions ⓙ to ⓜ can be established by adjusting the ECR magnetic field coils 109 and 113, and the distance between the substrate and the ECR position can be controlled by adjustably setting the position of the substrate holder 103.

Figure 21G:
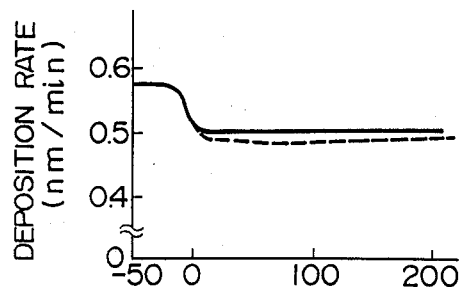
Figure 21H:
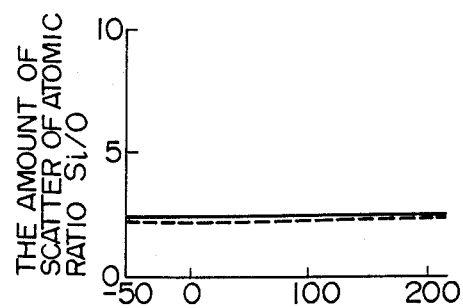
Figure 22A:
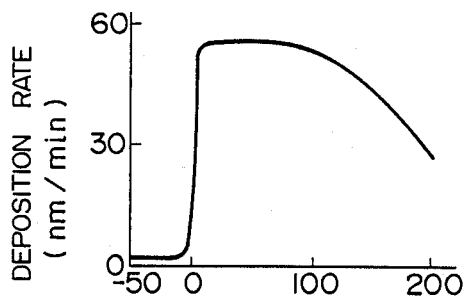
FIGS. 22a to 22h are graphs showing other experimental data obtained with the FIG. 19 apparatus.
Figure 22B:
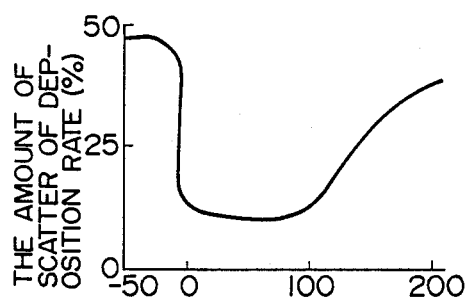
Figure 22C:
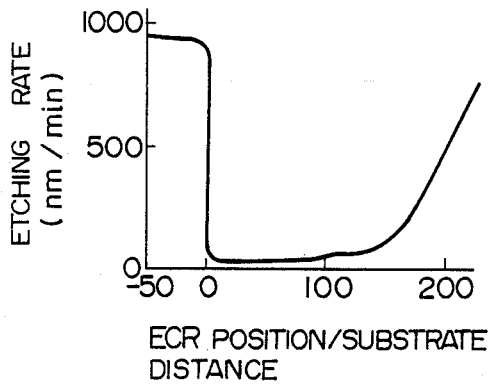
Figure 22D:
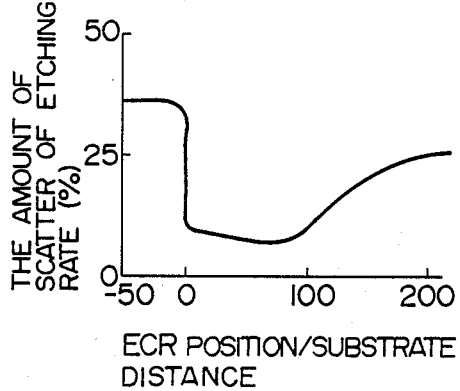
Figure 22E:
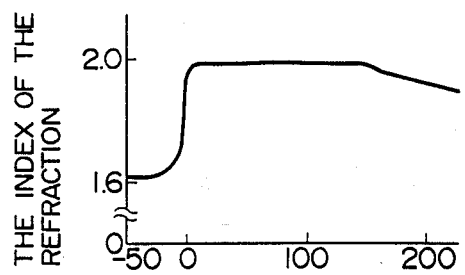
Figure 22F:
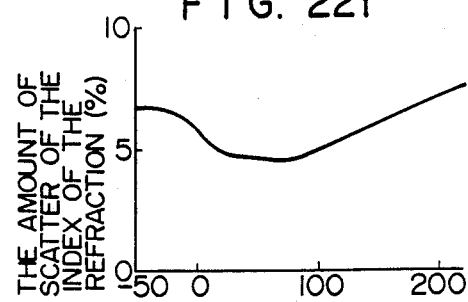
Figure 22G:
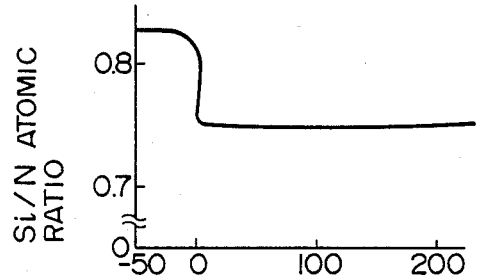
Figure 22H:
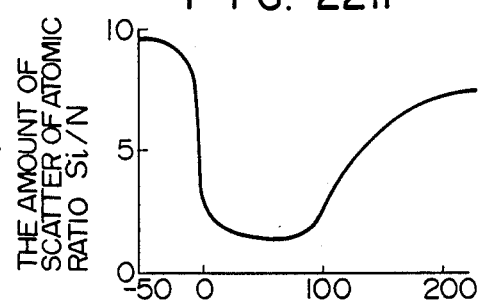

As the substrate 101 to be operated on, a silicon wafer having a diameter of 100 mm is used and a silicon oxide film is formed on the wafer. Oxygen is admitted at a flow rate of 40 ml/min into the plasma generation chamber 104 through the first gas inlet pipe 105 and a microwave 106 of 2.45 GHz propagating through the wave guide 107 is introduced into the plasma generation chamber 104 through the microwave incident window 108. Then, a magnetic field of 875 Gausses or more is generated from the static magnetic field generation coils 109 and 113 both disposed externally of and concentrically with the plasma generation chamber to generate a plasma flux 110 and monosilane ($SiH_4$) is admitted at a flow rate of 6 ml/min through the second gas inlet pipe 111 into the operation chamber 102 which is evacuated by the evacuation system to a reduced pressure of 1 m Torr. The magnetic flux density distribution is controlled by adjusting the amount of current passed through the static magnetic field generation coils 109 and 113 or the distance between the ECR position and the substrate to be operated is adjustably changed by adjusting the position of the substrate holder. With respect to the ECR position/substrate distance d, the $SiO_2$ film deposition rate and the amount of scatter of the deposition rate within the substrate are graphically depicted in FIGS. 21a and 21b, the etching rate for the deposited film under etching with a buffer etching solution (a mixture of 1-mol HF and 6-mol $NH_4F$) and the amount of scatter of the etching rate within the substrate are graphically depicted in FIGS. 21c and 21d, the index of refraction of the deposited film and the amount of scatter of the index of refraction within the substrate are graphically depicted in FIGS. 21e and 21f and the Si/O atomic ratio in the deposited film measured through Auger electron spectroscopy and the amount of scatter of the Si/O atomic ratio within the substrate are graphically depicted in FIGS. 21g and 21h. In these Figures, broken-line curves are representative of results obtained when the substrate is positioned within the plasma generation chamber. FIG. 21a demonstrates that the deposition rate is relatively high within the range of distance d of from 0 to 150 mm, especially, begins to increase around d≃100 mm, and FIG. 21b demonstrates that the amount of scatter of the deposition rate is small within the range of distance d of from 0 to 70 mm, indicating excellent uniformity. FIG. 21c demonstrates that the etching rate is low within the range covering a distance d of 150 mm or less, indicating that films of high densification can be prepared within this range and FIG. 21d demonstrates that excellent uniformity can be obtained within the range of distance d of from 0 to 70 mm. FIG. 21e demonstrates that the deposited film has an index of refraction approximating that of a film prepared by thermal oxidation within the range of distance d of from 0 to 150 mm and FIG. 21f demonstrates that excellent uniformity can be obtained within the range of distance d of from 0 to 70 mm. FIG. 21g demonstrates that the Si/O atomic ratio is 0.5 within the range covering a distance d of 0 (zero) or more and FIG. 21h demonstrates that uniformity is excellent.

When the distance d between the ECR position and the substrate to be operated is changed within the operation chamber by adjusting the position of the substrate holder while keeping the magnetic flux density distribution unchanged, the same results as those described above can be obtained. When the substrate is positioned within the plasma generation chamber, more specifically, between the first and second gas inlet pipes, results are different from those obtained with the substrate positioned within the operation chamber as indicated by broken-line curves in FIGS. 21a to 21h, particularly exhibiting a decrease in the deposition rate and a degraded distribution of the deposition rate. In view of the above-described experimental data related to the distance between the ECR position and the substrate to be operated, it may be concluded that the deposited film having the excellent quality comparable to the above data can be prepared. This means that the characteristic of the film deposition by microwave plasma discharge greatly depends on the maximum generation region for the plasma activated species, that is, the distance between the ECR position and the substrate in the apparatus. Further, it should be understood that the desirable value of distance d free from the influence of the deactivation of activated species due to its life and interaction such as collision with inactive molecules is below the mean free path of the activated species. Furthermore, it has been proved that within the range of distance d of from 0 to 70 mm, uniformity of produced films and film quality is excellent and this range coincides with the range of deactivation time of such an activated species as $SiH_2^+$ of monosilane. In the latter range, the range of deactivation time corresponds to the range of lifetime within which the activated species makes a transition from a highly excited state to the ground state of zero electron energy.

NINTH EMBODIMENT

In the apparatus shown in FIG. 19, a nitrogen gas, as opposed to the oxygen gas of the eighth embodiment, is admitted at a flow rate of 40 ml/min to the plasma generation chamber through the first gas inlet pipe, a monosilane ($SiH_4$) gas is admitted at a flow rate of 6 ml/min to the operation chamber through the second gas inlet pipe, and a $Si_3N_4$ film is deposited inside the operation chamber which is evacuated to a pressure of 1 m Torr. Results are graphically illustrated in FIGS. 22a to 22h. As in the case of the $SiO_2$ film deposition described with reference to FIGS. 21a to 21h, the deposition rate, etching rate for the film, index of refraction, stoichiometric ratio and their amounts of scatter within the substrate greatly depend on the distance d between the ECR position and the substrate. Within the range covering a distance d of zero or more, the stoichiometric ratio (Si/N mol ratio) is constant and within the range of distance d of from 0 to 150 mm, the etching rate for the deposited film and the index of refraction thereof equalling or approximating those of a thermal nitrogenated film can be obtained and the deposition rate is high. Within the range of distance d of from 0 to 70 mm, uniformity of the deposited film within the substrate is relatively high as in the case of the $SiO_2$ deposited film.

TENTH EMBODIMENT

Figure 23A:
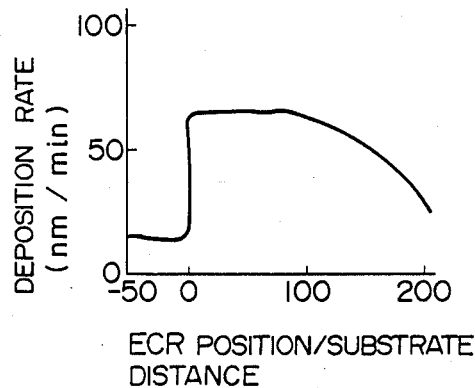
FIGS. 23a and 23b, 24a and 24b, 25a and 25b and 26a and 26b are graphs showing further experimental data obtained with the FIG. 19 apparatus.
Figure 23B:
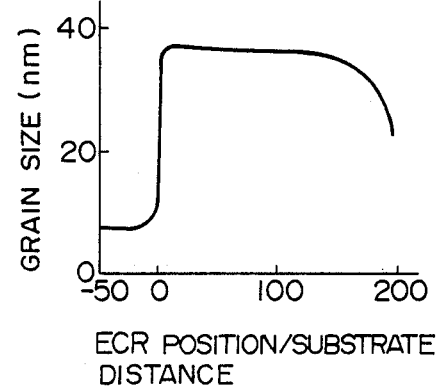

In the apparatus shown in FIG. 19, a hydrogen gas is admitted to the plasma generation chamber through the first gas inlet pipe, a monosilane (SiH$_4$) gas is admitted to the operation chamber through the second gas inlet pipe, and a polycrystalline silicon film is deposited inside the operation chamber by maintaining the substrate at a temperature of 320° C. Results are graphically illustrated in FIGS. 23a and 23b. It will be seen from these Figures that within the range of distance d of from 0 to 150 mm, the deposition rate is high and the crystal grain size of the polycrystalline silicon examined through X-ray diffraction is high, exhibiting excellent crystallinity.

ELEVENTH EMBODIMENT

In the apparatus of FIG. 19, a hydrogen gas is admitted through the first gas inlet pipe, a tungsten hexafluoride (WF$_6$) gas is admitted through the second gas inlet pipe, and a tungsten film is deposited inside the operation chamber which is at a reduced pressure of 0.3 m Torr.

Figure 24A:
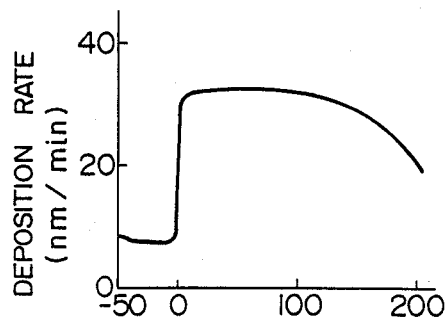
Figure 24B:
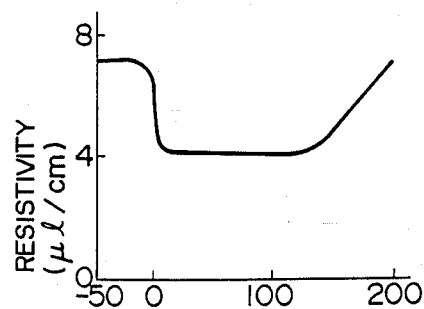

As graphically shown in FIGS. 24a and 24b, within the range of distance d of from 0 to 150 mm, a low-resistance film having a resistivity of 4.0 $\mu\Omega$/cm approximating that of a bulk resistor can be deposited efficiently. At that reduced pressure, a WF$_6$ activated species has, in its life, a mean free path approximating that of a SiH$_4$ activated species and the character of the deposited film proves to be excellent within the range of deactivation time.

TWELFTH EMBODIMENT

Figure 25A:
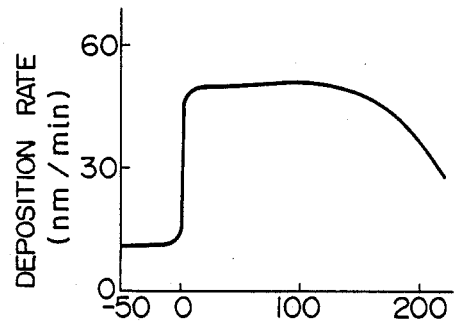
Figure 25B:
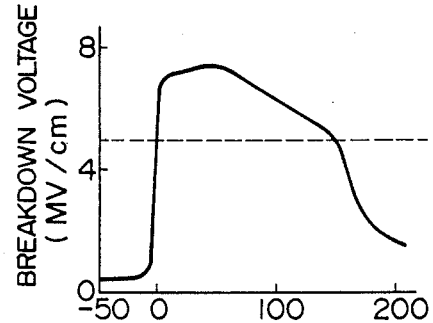

In the apparatus of FIG. 19, a mixture gas of hydrogen and nitrogen is admitted through the first gas inlet pipe, trichloro aluminum (AlCl$_3$) carried by a N$_2$ carrier is admitted through the second gas inlet pipe, and Aluminum nitride is deposited inside the operation chamber. Measurement results of deposition rate and breakdown voltage of the deposited film are graphically depicted in FIGS. 25a and 25b. Within the range of distance d of from 0 to 150 mm, an excellent insulator having a breakdown voltage of 5 MV/cm or more can be prepared efficiently. The surface state density of this deposited film is excellent, measuring $10^{10}$ cm$^{-2}$.

THIRTEENTH EMBODIMENT

Figure 26A:
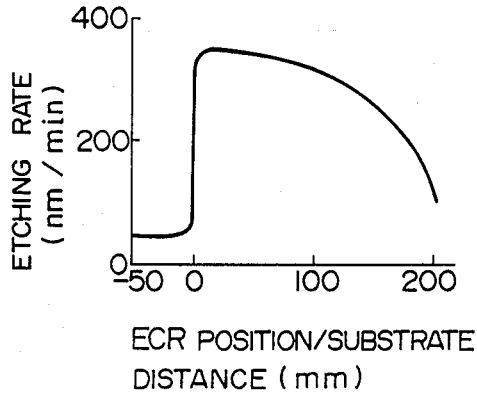
Figure 26B:
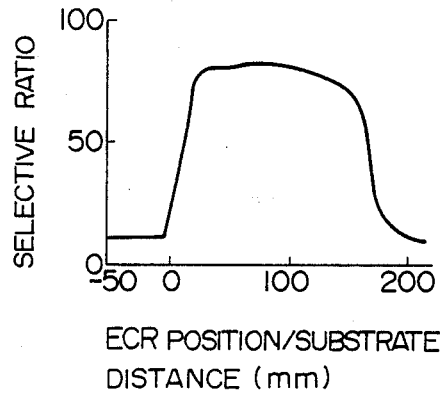

In the apparatus of FIG. 19, a sulfur hexafluoride (SF$_6$) gas is admitted through the first gas inlet pipe so as to etch polycrystalline silicon. Measurement results of etching rate for the polycrystalline silicon and etching selective ratio (Si/SiO$_2$) are graphically depicted in FIGS. 26a and 26b. Within the range of distance d of from 0 to 150 mm, the polycrystalline silicon can be etched highly selectively and efficiently.

The previous eighth to thirteenth embodiments show that the microwave operation efficiency and the character of deposited films greatly depend on the distance d between the ECR position and the substrate to be operated on, that is, the life of plasma activated species and the deactivated degree of electron energy of the activated species due to interaction, such as collision with inactive species or the decreasing degree of vibration, rotation and translation energy and as a result, the excellent deposition rate and film quality can be obtained within the range of distance d of from 0 to 150 mm. Particularly, under the influence of distributions of the life of plasma activated species and of the deactivated degree, uniformity of the deposition rate and film quality can be high within the range of distance d of from 0 to 70 mm.

Thus, according to these embodiments, the distance between the ECR position and the substrate is made less than 150 mm, thereby ensuring that in the microwave plasma operation, the film deposition rate can be improved to realize a consequent improvement in throughput and that films having crystallinity and densification comparable to those of films prepared by high temperature chemical reaction can be deposited on the operated substrate which is even at low temperatures.

The foregoing embodiments have been described by way of an example of the ECR conditioning position having the distribution so configured as to lie on a curved surface.

In embodiments to be described hereinafter, the shape of distribution of the resonance conditioning position will be discussed in particular.

Thus, the following embodiments are relevant to the aforementioned third feature of the present invention.

Where the angular frequency of a microwave applied is $\omega$, the magnetic flux density of a static magnetic field is B and the mass of electron is m$_e$, the the electron has a rotational angular frequency $\omega_e$ which is $\omega_e = eB/m_e$ in the static magnetic field as is known in the art. When the ECR condition of $\omega = \omega_e$ is satisfied, energy of the microwave is continuously applied to the electron and the ionization efficiency of plasma is increased considerably. As a result, the generation efficiency of a plasma activated species is also increased considerably. Especially where the magnetic field is a divergent magnetic field having a magnetic flux density distribution in the axis direction of the apparatus in which the magnitude of magnetic flux density is maximum at the edge of the plasma generation chamber and decreases monotonously toward the operation chamber, an ECR surface substantially orthogonal to the plasma flux is set up at a position inside the apparatus at which B (Z, r) = $\omega_e$m$_e$/e stands when the main mode of electric field distribution of the microwave is TE$_{01}$ mode. In the above formula, Z is a coordinate position on a vacuum-chamber-center-axis coordinate system which is positive in the direction of plasma flux, r is the radius of rotational motion of the electron and e is the electric charge of the electron.

Since the incoming microwave contains other modes of electric field distribution and the propagation surface has unevenness in terms of permeability, the ECR surface is, in effect, expanded into an effective ECR range having an ECR efficiency distribution in the direction of propagation. In the vicinity of this effective ECR range, a high generation efficiency range of plasma activated species is set up having a distribution similar to the ECR efficiency distribution. Accordingly, if the high generation efficiency range can be enlarged, the concentration of plasma activated species can be increased and consequently the operation efficiency for the operated object can be increased. As regards the plasma operation characteristics, when taking deposition of a film on the substrate, for instance, the greater the level and duration of the electron energy, vibration between bonded atoms and rotation and translation energy of molecules or atoms to be deposited, the higher is the probability that in the plasma, the molecules or atoms are not ganged and that the single particle concentration increases. Under this condition, the deposited film can approach thermal chemical reaction stoichiometry. Further, when an activated species having the above high kinetic energy is deposited, this activated species has a high probability of its reconfigurational and reorientational motion toward a molecular or atomic layer preexistent on the substrate until the energy of the activated species is minimized at a destination of the reconfigurational and reorientational motion. Therefore, the higher the concentration of the deposited activated species having the high kinetic energy, the more the densification and crystallinity of the deposited film can be improved. In addition, stoichiometric ratio of the deposited film approaches that of a film prepared by thermal chemical reaction.

Additionally, by decreasing the distance between the ECR range and the substrate, the degree of deactivation of the plasma activated species due to inter-molecule interaction such as based on collision can be decreased and therefore it is expected that the operation can be performed more efficiently and properly.

If, otherwise, the magnetic field distribution B (Z) is not monotonously decreasing, the microwave is prevented from propagating at a position satisfying $dB/dZ>0$ and the production efficiency of the plasma activated species is disadvantageously degraded.

FOURTEENTH EMBODIMENT

Figure 27:
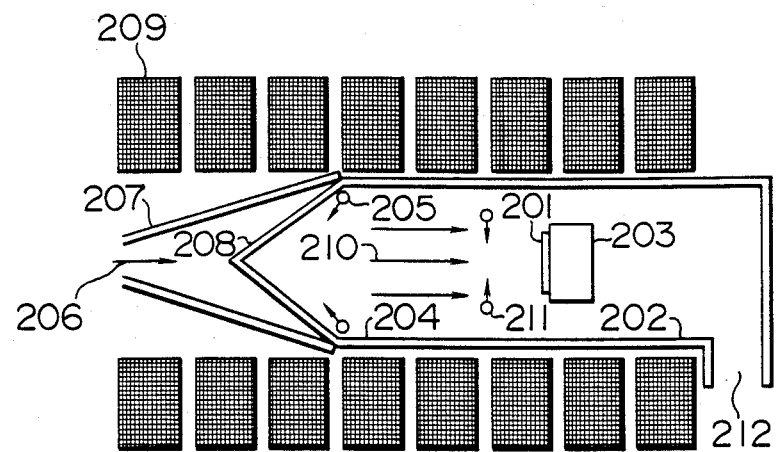
FIG. 27 is a schematic diagram showing a plasma operation system according to a fourteenth embodiment of the invention.
Figure 28A:
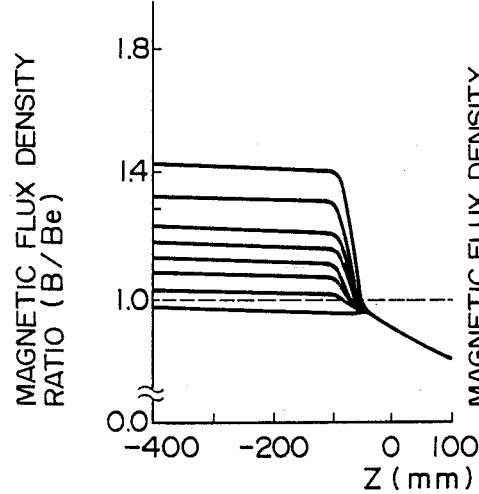
FIGS. 28a and 28b are graphs showing axial magnetic flux density distributions in the apparatus of FIG. 27.
Figure 28B:
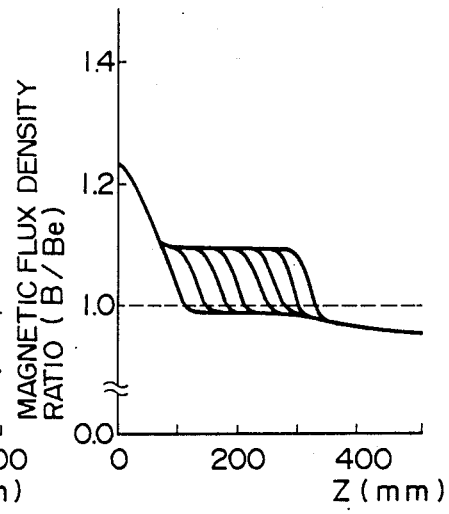

The essential part of a plasma operation apparatus according to a fourteenth embodiment of the invention is schematically illustrated in FIG. 27. The apparatus comprises a plasma generation chamber 204, a microwave guide 207 (an oscillator for a microwave 206 is not illustrated), ECR magnetic field coils 209 and 213, an operation chamber 202, an evacuation conduit 212 (an evacuation system is not illustrated), reaction gas supply nozzles 205 and 211 (a reaction gas supply system is not illustrated), and a substrate holder 203. The plasma generation chamber 204 is made of colorless quartz and has a diameter of 240 mm and a length of 250 mm with its top cone serving as a microwave incident window 208. The ECR magnetic field coils 209 and 213 respectively surround the plasma generation chamber and the operation chamber and are operable to provide a maximum of magnetic field density of 3.0K Gausses within the plasma generation chamber. The ECR magnetic field coils 209 and 213 are respectively divided into five and three sub-coils. Magnitude and direction of currents supplied to these sub-coils can be adjusted separately to control the magnetic flux density. The operation chamber 202 is made of stainless and has a diameter of 240 mm. The substrate holder 203 having a diameter of 120 mm and placed in the operation chamber is made of alumina and its position is variable along the direction of plasma flux (in the right and left directions in the drawing). Various distributions can be set up by adjusting the coils 209 and 213 and by adjustably setting the position of the substrate holder 203 to keep constant the distance between the substrate and the ECR position (at which the magnetic flux density is resonance conditioning magnetic flux $B_o$ on the assumption that the microwave propagation and excitation are uniform and only the $TE_{01}$ mode of the microwave is taken into consideration). FIGS. 28a and 28b graphically illustrate magnetic flux density distributions represented by B (Z), where Z is a coordinate position on a vacuum-chamber-center-axis coordinate system which is positive in the direction of plasma flux and has the origin at the substrate in the case of FIG. 28a and at the edge of the plasma generation chamber in the case of FIG. 28b. In particular, FIG. 28a shows examples of magnetic field distributions established when a distribution of predetermined shape is changed by changing the intensity of magnetic field at a uniform rate and FIG. 28b shows examples of magnetic field distributions established when a distribution obtained for substantially constant $B/B_e$ measuring about 1.1 is changed by changing the distance between the ECR position and the substrate.

Figure 29A:
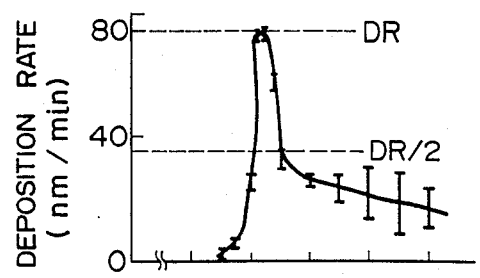
FIGS. 29a to 29h are graphs showing experimental data obtained with the FIG. 27 apparatus to prove characteristics thereof.
Figure 29B:
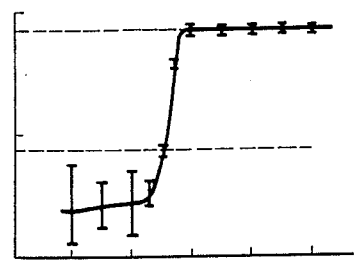
Figure 29C:
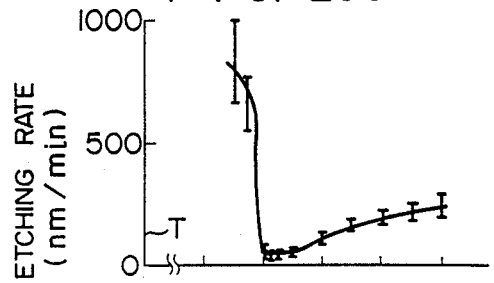
Figure 29D:
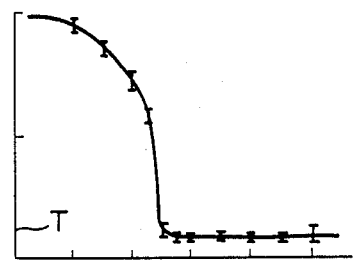
Figure 29E:
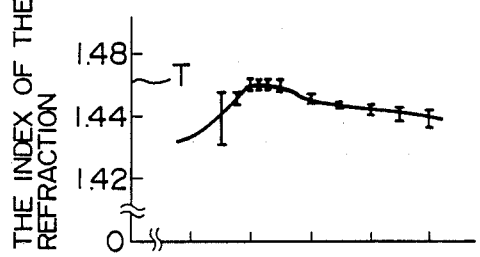
Figure 29F:
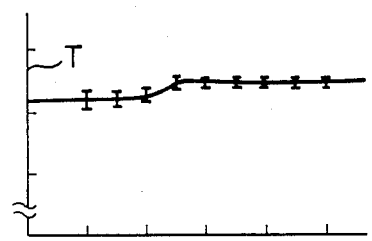
Figure 29G:
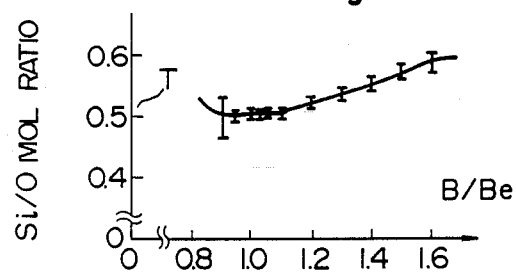
Figure 29H:
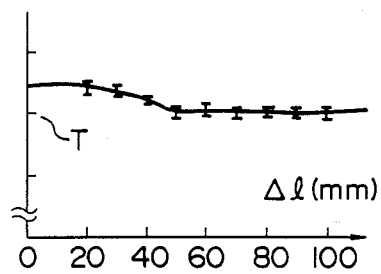

As the substrate 208 to be operated, a silicon wafer having a diameter of 100 mm is used and a silicon oxide film is formed on the wafer. Oxygen ($O_2$) is admitted at a flow rate of 40 ml/min into the plasma generation chamber 204 through the first gas inlet pipe 205, a microwave 206 of 2.45 GHZ is introduced into the plasma generation chamber, a magnetic field of 875 Gausses or more is generated from the static magnetic field generation coils 209 and 213 to generate a plasma flux 210, monosilane ($SiH_4$) is admitted at a flow rate of 6 ml/min through the second gas inlet pipe 211 into the operation chamber 202 which is evacuated by the evacuation system to a reduced pressure of 1 m Torr. The magnetic flux density distribution is controlled by adjusting the amount of currents passed through the static magnetic field generation coils 209 and 213. A $SiO_2$ film is deposited by raising, as shown in FIG. 28a, the magnitude of magnetic flux density so as to change of ECR range while keeping constant the distance between the substrate and the ECR position or by decreasing, as shown in FIG. 28b, the distance between the substrate and the ECR position while keeping the magnitude of magnetic flux density substantially constant. FIG. 29a graphically depicts dependency of the $SiO_2$ deposition rate upon the magnetic flux density affecting the effective ECR range, and FIG. 29b graphically depicts dependency of the deposition rate upon the length of the effective ECR range. In FIGS. 29a and 29b, errors are maximum errors for the same substrate. FIG. 29c graphically depicts dependency of the etching rate for the deposited film under etching with a buffer etching solution (a mixture of 1-mol HF and 6-mol $NH_4F$) upon the magnetic flux density for the effective ECR range, FIG. 29d depicts dependency of the etching rate upon the length of the effective ECR range, FIG. 29e depicts dependency of the optical index of refraction of the deposited film upon the magnetic flux density, FIG. 29f depicts dependency of the index of refraction upon the length, FIG. 29g depicts dependency of the Si/O mol ratio in the deposited film measured through Auger electron spectroscopy upon the magnetic flux density, and FIG. 29h depicts dependency of the Si/O mol ratio upon the length. The value of B is measured for the distance between the ECR position and the substrate being 100 mm, and the distance $\Delta l$ is measured for $B/B_o \simeq 1.0$ to 1.1.

FIGS. 29a and 29b demonstrate that the deposition rate is highly efficient for the B being 1.0 to 1.1 and for the $\Delta l$ being 50 mm or more. FIGS. 29c and 29d demonstrate that the etching rate is low also for the $B/B_o$ being 1.0 to 1.1 and for the $\Delta l$ being 50 mm or more, indicating that the deposited film proves to be of high densification. Further, FIGS. 29e, 29f, 29g and 29h demonstrate that for the being 1.0 to 1.1 and the $\Delta l$ being 50 mm or more, a deposited film comparable to a thermally oxygenated film can be prepared. It is therefore concluded that there exists the effective ECR range in the microwave plasma operation and that highly efficient operations and high-quality deposited films can be obtained by enlarging the effective ECR range.

FIFTEENTH EMBODIMENT

Figure 30A:
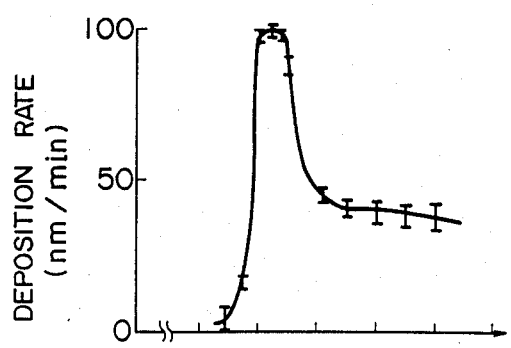
FIGS. 30a to 30d are graphs showing other experimental data obtained with the FIG. 27 apparatus.
Figure 30B:
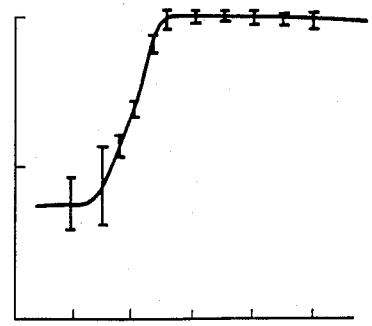
Figure 30C:
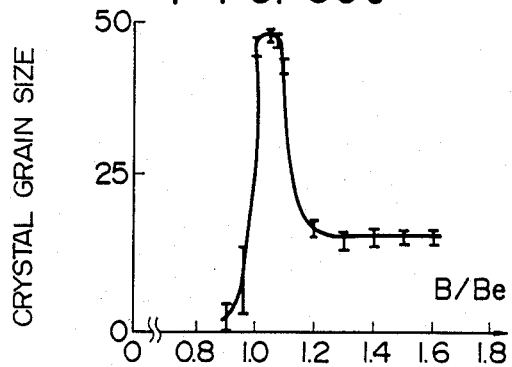
Figure 30D:
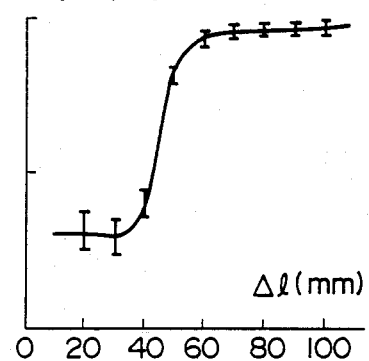

In the apparatus shown in FIG. 27, Hydrogen is admitted to the plasma generation chamber through the first gas inlet pipe 205, a monosilane (SiH$_4$) gas is admitted into the operation chamber through the second gas inlet pipe 211, and a polycrystalline silicon film is deposited on the substrate which is maintained at a temperature of 320° C. FIGS. 30a and 30b graphically depict results, indicating that the deposition rate is high for the B/B$_e$ being 1.0 to 1.1 and the Δl being 50 mm or more. Examination based on X-ray diffraction has proven that the polycrystalline silicon prepared under the above conditions has a large grain size as shown in FIGS. 30c and 30d, exhibiting excellent crystallinity.

SIXTEENTH EMBODIMENT

Figure 31A:
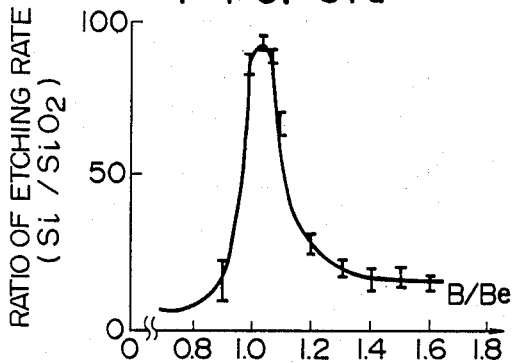
FIGS. 31a and 31b are graphs showing further experimental data obtained with the FIG. 27 apparatus.
Figure 31B:
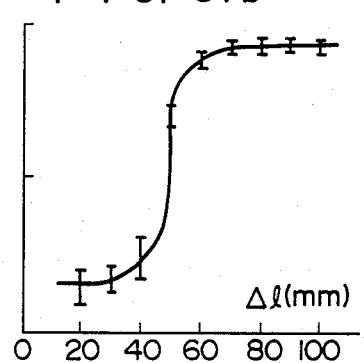

In the apparatus of FIG. 27, sulfur hexafluoride (SF$_6$) is admitted through the first gas inlet pipe to etch a polycrystalline silicon film. FIGS. 31a and 31b show results, indicating that, as in the case of the fourteenth and fifteenth embodiments, for the B/B$_e$ being 1.0 to 1.1 and the Δl being 50 mm or more, selective etching for polycrystalline silicon material which is required for etching LSI gate materials can be performed.

It will be understood from the previous fourteenth to sixteenth embodiments that the microwave plasma operation efficiency and operation characteristics greatly depend upon breadth of the effective ECR range. Accordingly, the concentration of the plasma activated species can be increased by enlarging the effective ECR range to improve efficiency of plasma operations and the quality of deposited films or etching characteristic therefor can be made excellent by maintaining the high energy state of the activated species for a long period of time, thereby optimizing the plasma operation. The above advantages can be attained by establishing the continuous range in which the magnitude of magnetic flux density is 1.0 to 1.1 times the magnitude of magnetic flux density necessary for the theoretical ECR condition in the TE$_{01}$ mode of the microwave and by setting the length of that range to be 50 mm or more.

Thus, according to these embodiments, the film deposition rate and operation efficiency can be improved in the microwave plasma operation and consequently the throughput of manufacture process can be improved. Further, in film deposition, films having crystallinity and densification comparable to those of films prepared by high temperature chemical reaction can be deposited on the operated substrate which is even at low temperatures.

What we claim is:

1. A plasma operation apparatus comprising:
   a discharge tube forming a part of discharge space and into which a discharge gas is admitted;
   magnetic field generation means for generating a magnetic field within the discharge space in said discharge tube;
   means for introducing a microwave into the discharge space in said discharge tube; and
   a specimen chamber coupled to said discharge tube and housing a specimen stand for holding a specimen to be operated,
   said magnetic field has magnetic flux density having the shape of distribution which substantially monotonously decreases, starting form the microwave incident space, toward said specimen stand, wherein a resonance conditioning position at which said magnetic field and microwave cooperate together to cause electron cyclotron resonance is located at least partially within said specimen chamber.

2. A plasma operation apparatus comprising:
   a discharge tube forming a part of discharge space and into which a discharge gas is admitted;
   magnetic field generation means for generating a magnetic field within the discharge space in said discharge tube;
   means for introducing a microwave into the discharge space in said discharge tube; and
   a specimen chamber coupled to said discharge tube and housing a specimen stand for holding a specimen to be operated,
   wherein said magnetic field has magnetic flux density having the shape of distribution by which a resonance conditioning position at which said magnetic field and microwave cooperate together to cause electron cyclotron resonance can lie on a curved surface, and said resonance conditioning position is located at least partially within said specimen chamber.

3. A plasma operation apparatus comprising:
   a discharge tube forming a part of discharge space and into which a discharge gas is admitted;
   magnetic field generation means for generating a magnetic field within the discharge space in said discharge tube;
   means for introducing a microwave into the discharge space in said discharge tube; and
   a specimen chamber coupled to said discharge tube and housing a specimen stand for holding a specimen to be operated,
   wherein said apparatus has complemental magnetic field generation means for causing a resonance conditioning position at which electron cyclotron resonance is caused by said magnetic field and microwave to be located at least partially within said specimen chamber.

4. A plasma operation apparatus according to claim 3 wherein said complemental magnetic field generation means is disposed externally of said specimen chamber and substantially in parallel with said specimen stand.

5. A plasma operation apparatus according to claim 3 wherein said complemental magnetic field generation means is disposed internally of said specimen chamber and substantially in parallel with said specimen stand.

6. A plasma operation apparatus according to claim 3 wherein said complemental magnetic field generation means is disposed at a substantially intermediate position between said discharge tube and specimen chamber.

7. A plasma operation apparatus according to claim 3 wherein said complemental magnetic field generation means is disposed at the back of said specimen stand.

8. A plasma operation apparatus according to claim 3 wherein said complemental magnetic field generation means plays the part of said specimen stand.

9. A plasma operation apparatus comprising:
   a discharge tube forming a part of discharge space and into which a discharge gas is admitted;
   magnetic field generation means for generating a magnetic field within the discharge space in said discharge tube;
   means for introducing a microwave into the discharge space in said discharge tube; and a specimen chamber coupled to said discharge tube and housing a specimen stand for holding a specimen to be operated, wherein said magnetic flux generation means provides a magnetic flux having a magnitude which causes a resonance conditioning position, at which electron cyclotron resonance is caused by said magnetic field and microwave, to be located at least partially within said specimen chamber.

10. A plasma operation apparatus comprising:
a discharge tube forming a part of discharge space and into which a discharge gas is admitted;
magnetic field generation means for generating a magnetic field within the discharge space in said discharge tube;
means for introducing a microwave into the discharge space in said discharge tube; and
a specimen chamber coupled to said discharge tube and housing a specimen stand for holding a specimen to be operated,
wherein the maximum magnetic flux density within said discharge tube is about 1.5 or more times the magnitude of magnetic flux density at a resonance conditioning position at which said magnetic field and microwave cooperate together to cause electron cyclotron resonance.

11. A plasma operation apparatus comprising:
a discharge tube forming a part of discharge space and into which a discharge gas is admitted;
magnetic field generation means for generating a magnetic field within the discharge space in said discharge tube;
means for introducing a microwave into the discharge space in said discharge tube; and
a specimen chamber coupled to said discharge tube and housing a specimen stand for holding a specimen to be operated,
wherein complemental magnetic field generation means is disposed externally of said specimen chamber, for causing a resonance conditioning position at which electron cyclotron resonance is caused by said magnetic field and microwave, to be located at least partially within said specimen chamber, and said complemental magnetic field generation means provides magnetic flux density having a magnitude which is greater than or equal to 50 Gausses or more.

12. A plasma operation apparatus comprising:
a discharge tube forming a part of discharge space and into which a discharge gas is admitted;
magnetic field generation means for generating a magnetic field within the discharge tube in said discharge tube;
means for introducing a microwave into the discharge space in said discharge tube; and
a specimen chamber coupled to said discharge tube and housing a specimen stand for holding a specimen to be operated,
wherein said magnetic field has magnetic flux density having a shape of distribution which substantially monotonously decreases, starting from the microwave incident discharge space, toward said specimen stand, a resonance conditioning position at which said magnetic field and microwave cooperate together to cause electron cyclotron resonance, is located at least partially within said specimen chamber, and complemental magnetic field generation means is provided for controlling a radius and a density of a plasma flux drawn into said specimen chamber.

13. A plasma operation apparatus wherein a magnetic field distribution is monotonously decreasing, a starting from a microwave incident window, toward a substrate to be operated upon and wherein said substrate is operated upon within a range which is 150 mm or less distant from an electron cyclotron resonance position.

14. A plasma operation apparatus wherein a magnetic field distribution is monotonously decreasing, starting from a microwave incident window, toward a substrate to be operated upon and wherein said substrate is operated on within a range which is the mean free path of active species or less distance from the electron cyclotron resonance position.

15. A plasma operation apparatus according to claim 13 wherein the position of said operated substrate is adjustably movable in the incident direction of the microwave.

16. A plasma operation apparatus according to claim 13 wherein the electron cyclotron resonance position is adjustable through adjustment of the magnetic field distribution.

17. A plasma operation apparatus comprising a microwave incident window, a vacuum evacuation system, a reaction gas supply system and magnetic field generation means for generating a magnetic field necessary for causing electron cyclotron resonance, wherein a range in which the magnitude of magnetic flux density is 1.0 to 1.1 times the magnitude of magnetic flux density necessary for causing the electron cyclotron resonance of an incident microwave is continuously set up over a length of 50 mm or more in the direction of a plasma flux.

18. A plasma operation apparatus comprising:
a discharge tube forming a part of discharge space and into which a discharge gas is admitted;
magnetic field generation means for generating a magnetic field within the discharge space in said discharge tube;
means for introducing a microwave into the discharge space in said discharge tube; and
a specimen chamber coupled to said discharge tube and housing a specimen stand for holding a specimen to be operated,
wherein a resonance conditioning position at which said magnetic field and microwave cooperate together to cause electron cyclotron resonance is located at least partially within said specimen chamber and an additional number of resonance conditioning positions are located on a side of a specimen stand to which side a microwave is introduced.

* * * * *

UNITED STATES PATENT AND TRADEMARK OFFICE
CERTIFICATE OF CORRECTION

PATENT NO. : 4,876,983

DATED : 31 October 1989

INVENTOR(S) : Takuya FUKUDA et al.

It is certified that error appears in the above-identified patent and that said Letters Patent is hereby corrected as shown below:

In the Title Page: Change "[73] Assignees: Hitachi, Ltd.; Service Engineering Co. Ltd., both of Tokyo, Japan" to
--[73] Assignees: Hitachi, Ltd., Tokyo, and Hitachi Service Engineering Co., Ltd., Hitachi, both of Japan--.

Column 1, lines 48 and 49, change "axis ordinate" to -- ordinate axis --.

Column 1, line 52, change "and abscissa" to -- and a value along the abscissa --.

Column 3, line 13, after "microwave" insert -- , --.

Column 3, line 14, after "field" insert -- , --.

Column 3, line 19, after "operated" insert -- upon --.

Column 3, line 22, after "films" insert -- , --.

Column 3, line 23, after "films" insert -- , --.

Column 3, line 33, change "improve characteristics" to -- improve the characteristics --.

Column 3, line 65, after "operated" insert -- upon --.

Column 4, line 8, delete "of degree".

Column 4, line 20, after "operated" insert -- upon --.

UNITED STATES PATENT AND TRADEMARK OFFICE
CERTIFICATE OF CORRECTION

PATENT NO. : 4,876,983

DATED : 31 October 1989

INVENTOR(S) : Takuya FUKUDA et al.

It is certified that error appears in the above-identified patent and that said Letters Patent is hereby corrected as shown below:

Column 4, line 47, delete "the" and insert -- a --.

Column 4, line 66, change "shematic" to -- schematic --.

Column 5, line 12, change "the invention" to -- the present invention --.

Column 5, line 68, change "divergence is" to -- divergence, is --.

Column 6, line 1, change "stand is" to -- stand, is --.

Column 6, line 50, delete "for" and insert -- found in --.

Column 7, line 44, after "to" insert -- 4 --.

Column 7, line 45, delete "> 4 ".

Column 7, line 54, delete "to" and insert -- approaches --.

Column 8, line 3, after "high" insert -- , --.

Column 8, line 7, delete "the monotonously" and insert -- a gradually --.

Column 9, line 46, delete "monotonously" and insert -- gradually --.

Column 9, line 61, delete "monotonously" and insert -- gradually --.

Column 9, line 65, delete "besides" and insert -- thus --.

UNITED STATES PATENT AND TRADEMARK OFFICE
CERTIFICATE OF CORRECTION

PATENT NO. : 4,876,983

DATED : 31 October 1989

INVENTOR(S) : Takuya FUKUDA et al.

It is certified that error appears in the above-identified patent and that said Letters Patent is hereby corrected as shown below:

Column 10, line 24, change "particle." to -- particles. --.

Column 10, line 41, delete "monotonously" and insert -- gradually --.

Column 11, line 33, after "operated" insert -- upon --.

Column 12, line 7, after "operated" insert -- upon --.

Column 12, line 21, after "operated" insert -- upon --.

Column 13, line 63, after "collision" insert -- , --.

Column 14, line 25, change "the the electron" to -- the electron --.

Column 14, lines 37 and 38, delete "monotonously" and insert -- gradually --.

Column 15, line 21, delete "monotonously" and insert -- gradually --.

Column 16, line 9, after "operated" insert -- upon --.

Column 16, line 26, delete "of" and insert -- the --.

Column 16, line 51, change "B" to -- $B/B_o$ --.

Column 16, line 62, change "the being" to -- the $B/B_o$ being --.

Column 17, line 51, change "substrate which is even" to -- substrate even --.

UNITED STATES PATENT AND TRADEMARK OFFICE
CERTIFICATE OF CORRECTION

PATENT NO. : 4,876,983

DATED : 31 October 1989

INVENTOR(S) : Takuya FUKUDA et al.

It is certified that error appears in the above-identified patent and that said Letters Patent is hereby corrected as shown below:

Column 17, line 64, after "operated" insert -- upon --.

Column 17, lines 66 and 67, delete "monotonously" and insert -- gradually --.

Column 18, line 35, after "operated" insert -- upon --.

Column 19, line 3, after "operated" insert -- upon --.

Column 19, line 20, after "operated" insert -- upon --.

Column 19, line 37, after "operated" insert -- upon --.

Column 19, line 41, after "position" insert -- , --.

Column 19, line 47, change "Gausses or more." to
-- Gausses. --

Column 19, line 58, after "operated" insert -- upon --.

Column 19, line 61, delete "monotonously" and insert
-- gradually --.

Column 20, line 2, after "position" insert -- , --.

Column 20, line 11, delete "monotonously" and insert
-- gradually --.

Column 20, line 11, change ", a starting" to
-- , starting --.

Column 20, line 17, delete "monotonously" and insert
-- gradually --.

UNITED STATES PATENT AND TRADEMARK OFFICE
CERTIFICATE OF CORRECTION

PATENT NO. : 4,876,983

DATED : October 31, 1989

INVENTOR(S) : Takuya Fukuda et al.

It is certified that error appears in the above-identified patent and that said Letters Patent is hereby corrected as shown below:

Column 20, line 36, after "range" insert -- , --.

Column 20, line 52, after "operated" insert -- upon --.

Column 20, line 57, delete "additional" and insert -- odd --.

Signed and Sealed this

Fourteenth Day of May, 1991

Attest:

HARRY F. MANBECK, JR.

*Attesting Officer*   *Commissioner of Patents and Trademarks*